US012571247B2

(12) United States Patent
Glover et al.

(10) Patent No.: US 12,571,247 B2
(45) Date of Patent: Mar. 10, 2026

(54) SECURITY FEATURES FOR A SLIDING DOOR SYSTEM

(71) Applicant: AADG, INC., New Haven, CT (US)

(72) Inventors: Daniel Brian Glover, Franklin, TN (US); Jennifer Manning, Mesa, AZ (US)

(73) Assignee: AADG, INC., New Haven, CT (US)

( * ) Notice: Subject to any disclaimer, the term of this patent is extended or adjusted under 35 U.S.C. 154(b) by 137 days.

(21) Appl. No.: 17/831,666

(22) Filed: Jun. 3, 2022

(65) Prior Publication Data

US 2022/0389757 A1 Dec. 8, 2022

Related U.S. Application Data

(60) Provisional application No. 63/278,513, filed on Nov. 12, 2021, provisional application No. 63/278,515, (Continued)

(51) Int. Cl.
*E06B 7/16* (2006.01)
*E06B 1/20* (2006.01)
(Continued)

(52) U.S. Cl.
CPC .................. *E06B 7/16* (2013.01); *E06B 1/20* (2013.01); *E06B 1/52* (2013.01); *E06B 1/6015* (2013.01);
(Continued)

(58) Field of Classification Search
CPC ..... E06B 7/16; E06B 1/20; E06B 1/52; E06B 1/6015; E06B 1/62; E06B 3/26301;
(Continued)

(56) References Cited

U.S. PATENT DOCUMENTS 2,860,744 A 11/1958 Mascari
3,248,833 A 5/1966 Sklar
(Continued)

FOREIGN PATENT DOCUMENTS

CA 3062210 A1 5/2021
DE 102010049762 B3 3/2012
WO 2005121483 A1 12/2005

OTHER PUBLICATIONS

Cambridge Dictionary, "adjustable," https://dictionary.cambridge.org/us/dictionary/english/adjustable (last accessed on Sep. 23, 2024) (Year: 2024).*

(Continued)

*Primary Examiner* — Theodore V Adamos
(74) *Attorney, Agent, or Firm* — Moore & Van Allen PLLC; Jeffrey R. Gray

(57) ABSTRACT

A sliding door system having one or more sliding doors, door frames (e.g., static frames of different sizes for different wall thicknesses or adjustable frames that can be used to fit different wall thicknesses), sliding door hardware (e.g., tracks, wheels, soft closers, stops, or the like), header, door receiver, a plurality of seals, or the like. The sliding door system utilizes improvements to the components in order to provide security features, such as electromagnetic (EMC—EMI/RFI) shielding, sound resistance, blast resistance, forced entry and/or ballistic resistance, privacy features, light reduction, fire and/or smoke resistance, or the like to the sliding door system. In particular, the sliding door system allows for the use of the security features with the static or adjustable door frames described herein.

19 Claims, 25 Drawing Sheets

Related U.S. Application Data filed on Nov. 12, 2021, provisional application No. 63/276,230, filed on Nov. 5, 2021, provisional application No. 63/276,227, filed on Nov. 5, 2021, provisional application No. 63/197,770, filed on Jun. 7, 2021.

(51) Int. Cl.

| | |
|---|---|
| *E06B 1/52* | (2006.01) |
| *E06B 1/60* | (2006.01) |
| *E06B 1/62* | (2006.01) |
| *E06B 3/263* | (2006.01) |
| *E06B 3/46* | (2006.01) |
| *H05K 9/00* | (2006.01) |

(52) U.S. Cl.
CPC ............ *E06B 1/62* (2013.01); *E06B 3/26301* (2013.01); *E06B 3/26336* (2013.01); *E06B 3/4636* (2013.01); *H05K 9/0003* (2013.01); *H05K 9/0081* (2013.01); *E06B 2001/622* (2013.01); *E06B 2003/2635* (2013.01)

(58) Field of Classification Search
CPC ............... E06B 3/26336; E06B 3/4636; E06B 2003/2635; E06B 2001/622; H05K 9/0081; H05K 9/0003
See application file for complete search history.

(56) References Cited

U.S. PATENT DOCUMENTS

| | | | | |
|---|---|---|---|---|
| 3,420,003 | A | | 1/1969 | Cline |
| 3,571,995 | A | | 3/1971 | Kasprzak |
| 3,609,928 | A | * | 10/1971 | Mock ........................ E06B 1/30 52/214 |
| 3,654,734 | A | | 4/1972 | Lehman |
| 3,788,019 | A | | 1/1974 | Kiselewski |
| 3,793,788 | A | | 2/1974 | Collins |
| 3,906,671 | A | * | 9/1975 | Maldonado ............... E06B 1/20 49/505 |
| 4,018,022 | A | | 4/1977 | Fink |
| 4,642,954 | A | | 2/1987 | Sigerist |
| 4,674,248 | A | | 6/1987 | Hall |
| 4,705,916 | A | * | 11/1987 | Wadhera ............. H05K 9/0015 361/818 |
| 4,735,025 | A | | 4/1988 | Day |
| 4,782,630 | A | * | 11/1988 | Kleyn ........................ E06B 1/20 49/505 |
| 4,791,758 | A | | 12/1988 | Bauer et al. |
| 4,813,204 | A | * | 3/1989 | Rentschler ................ E06B 1/20 49/505 |
| 4,878,325 | A | | 11/1989 | Van Tuyl et al. |
| 4,986,034 | A | | 1/1991 | Mozuras et al. |
| 5,070,651 | A | * | 12/1991 | Jeter ........................ E06B 1/045 49/505 |
| 5,187,898 | A | * | 2/1993 | McKann ................... E06B 1/20 49/505 |
| 5,220,748 | A | * | 6/1993 | Chadbourne ............. E06B 1/64 49/505 |
| 5,233,802 | A | * | 8/1993 | Rogers ...................... E06B 1/20 49/505 |
| 5,294,270 | A | * | 3/1994 | Fenical .................... D04B 1/14 148/568 |
| 5,345,722 | A | | 9/1994 | Mckann |
| 5,392,574 | A | * | 2/1995 | Sayers ...................... E06B 1/30 52/204.55 |
| 5,412,909 | A | * | 5/1995 | Wu .......................... E06B 1/347 49/505 |
| 6,050,036 | A | * | 4/2000 | Frey ...................... E04B 2/7455 49/504 |
| 6,282,851 | B1 | | 9/2001 | Beaton |
| 6,639,145 | B1 | * | 10/2003 | Nurmi ................. H05K 9/0016 174/387 |
| 7,340,866 | B1 | * | 3/2008 | Smith ...................... E06B 1/30 52/745.15 |
| 8,650,818 | B1 | | 2/2014 | Smith |
| 8,806,812 | B2 | | 8/2014 | Kolovich et al. |
| 9,115,501 | B2 | | 8/2015 | Rucinski et al. |
| 10,273,742 | B2 | | 4/2019 | Strickland et al. |
| 10,851,572 | B1 | * | 12/2020 | Flynn .................... E06B 3/4636 |
| 11,286,712 | B2 | | 3/2022 | Macdonald et al. |
| 2007/0022699 | A1 | | 2/2007 | Wang |
| 2009/0077912 | A1 | | 3/2009 | Yeremian |
| 2010/0212239 | A1 | | 8/2010 | Wang |
| 2011/0179730 | A1 | | 7/2011 | Kolovich et al. |
| 2013/0192163 | A1 | | 8/2013 | Tatrault |
| 2018/0038149 | A1 | | 2/2018 | Strickland et al. |
| 2019/0128048 | A1 | | 5/2019 | Macdonald et al. |
| 2021/0047880 | A1 | * | 2/2021 | Gosling ............... E06B 7/2309 |
| 2021/0324675 | A1 | | 10/2021 | Liang et al. |
| 2022/0389748 | A1 | * | 12/2022 | Glover ................. H05K 9/0081 |
| 2022/0389749 | A1 | * | 12/2022 | Glover ................. E06B 7/231 |
| 2022/0389750 | A1 | * | 12/2022 | Glover ............... E06B 3/26336 |
| 2022/0389757 | A1 | | 12/2022 | Glover et al. |

OTHER PUBLICATIONS

AADG, Inc., Canadian Patent Application No. 3,161,828, Office Action, Oct. 31, 2023.
AADG, Inc., Canadian Patent Application No. 3,161,828, Office Action, Feb. 26, 2025.

* cited by examiner

30

40

11, 13

11, 15

17, 18

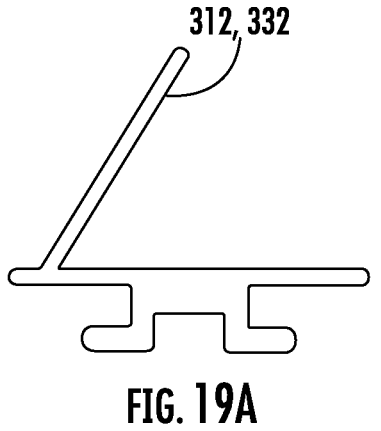
FIG. 19A
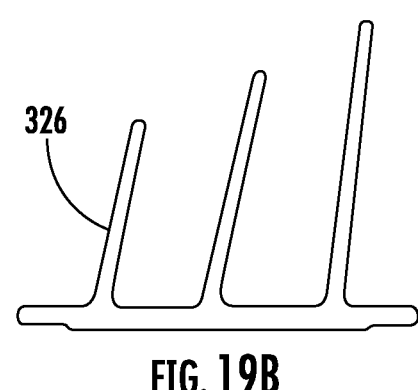
FIG. 19B
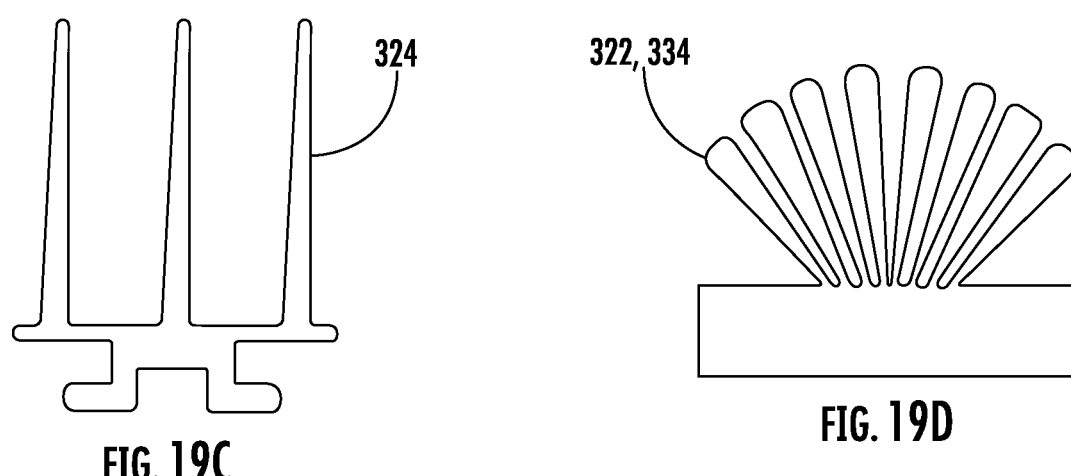
FIG. 19C
FIG. 19D
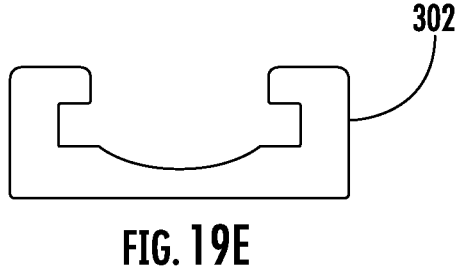
FIG. 19E

200

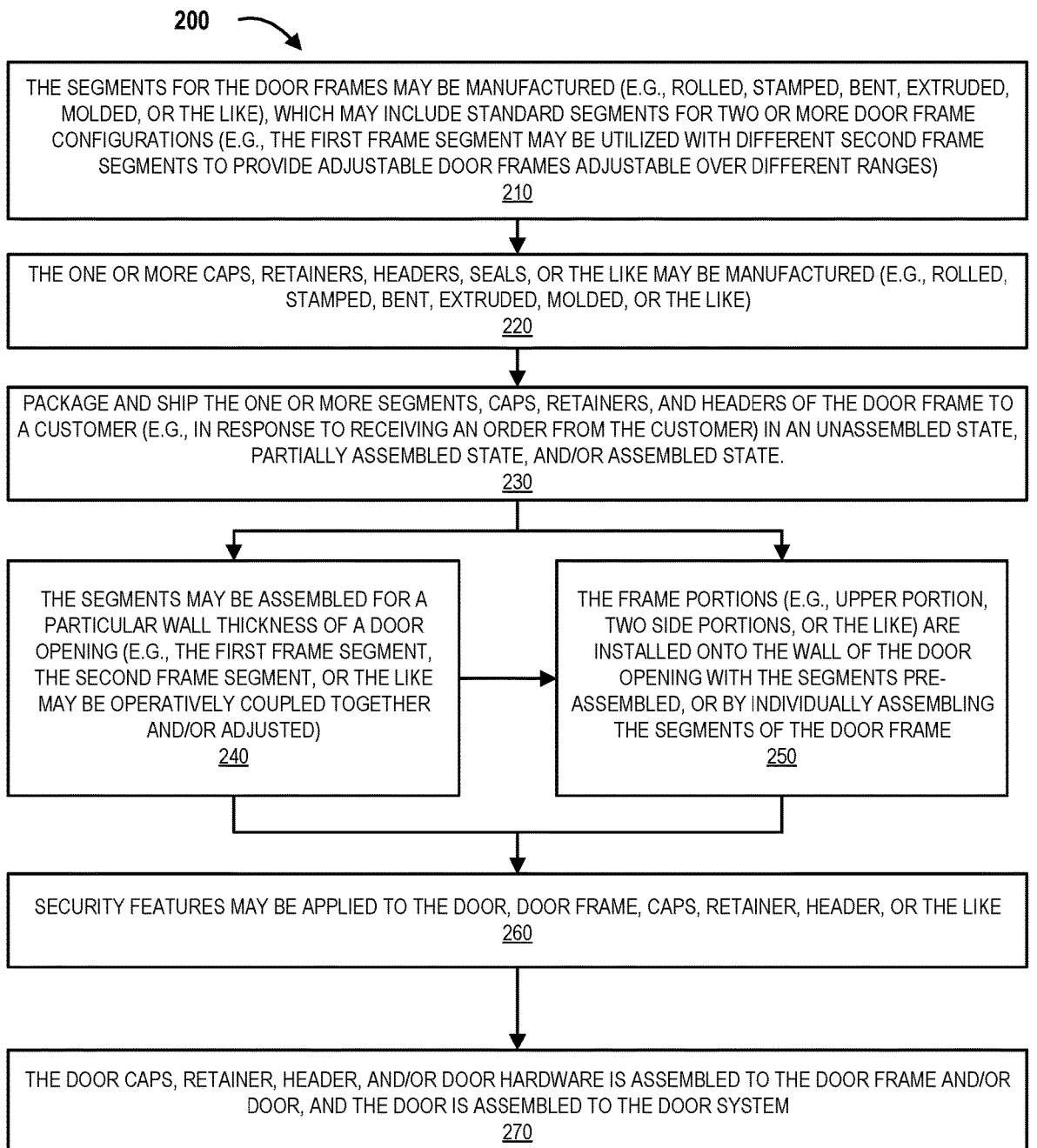

THE SEGMENTS FOR THE DOOR FRAMES MAY BE MANUFACTURED (E.G., ROLLED, STAMPED, BENT, EXTRUDED, MOLDED, OR THE LIKE), WHICH MAY INCLUDE STANDARD SEGMENTS FOR TWO OR MORE DOOR FRAME CONFIGURATIONS (E.G., THE FIRST FRAME SEGMENT MAY BE UTILIZED WITH DIFFERENT SECOND FRAME SEGMENTS TO PROVIDE ADJUSTABLE DOOR FRAMES ADJUSTABLE OVER DIFFERENT RANGES)
210

THE ONE OR MORE CAPS, RETAINERS, HEADERS, SEALS, OR THE LIKE MAY BE MANUFACTURED (E.G., ROLLED, STAMPED, BENT, EXTRUDED, MOLDED, OR THE LIKE)
220

PACKAGE AND SHIP THE ONE OR MORE SEGMENTS, CAPS, RETAINERS, AND HEADERS OF THE DOOR FRAME TO A CUSTOMER (E.G., IN RESPONSE TO RECEIVING AN ORDER FROM THE CUSTOMER) IN AN UNASSEMBLED STATE, PARTIALLY ASSEMBLED STATE, AND/OR ASSEMBLED STATE.
230

THE SEGMENTS MAY BE ASSEMBLED FOR A PARTICULAR WALL THICKNESS OF A DOOR OPENING (E.G., THE FIRST FRAME SEGMENT, THE SECOND FRAME SEGMENT, OR THE LIKE MAY BE OPERATIVELY COUPLED TOGETHER AND/OR ADJUSTED)
240

THE FRAME PORTIONS (E.G., UPPER PORTION, TWO SIDE PORTIONS, OR THE LIKE) ARE INSTALLED ONTO THE WALL OF THE DOOR OPENING WITH THE SEGMENTS PRE-ASSEMBLED, OR BY INDIVIDUALLY ASSEMBLING THE SEGMENTS OF THE DOOR FRAME
250

SECURITY FEATURES MAY BE APPLIED TO THE DOOR, DOOR FRAME, CAPS, RETAINER, HEADER, OR THE LIKE
260

THE DOOR CAPS, RETAINER, HEADER, AND/OR DOOR HARDWARE IS ASSEMBLED TO THE DOOR FRAME AND/OR DOOR, AND THE DOOR IS ASSEMBLED TO THE DOOR SYSTEM
270

*FIG.* 20

SECURITY FEATURES FOR A SLIDING DOOR SYSTEM

CROSS REFERENCE AND PRIORITY CLAIM UNDER 35 U.S.C. § 119

The present application for a patent claims priority to U.S. Provisional Patent Application Ser. No. 63/278,515 entitled "Adjustable Door Frame for a Sliding Door" filed on Nov. 12, 2021, U.S. Provisional Patent Application Ser. No. 63/278,513 entitled "Security Features for a Sliding Door System" filed on Nov. 12, 2021, U.S. Provisional Patent Application Ser. No. 63/276,227 entitled "Adjustable Frame with a Thermal Break Seal" filed on Nov. 5, 2021, U.S. Provisional Patent Application Ser. No. 63/276,230 entitled "Adjustable Frame With a Thermal Break" filed on Nov. 5, 2021, U.S. Provisional Patent Application Ser. No. 63/197, 770 entitled "Adjustable Door Frame With a Thermal Break" filed on Jun. 7, 2021, all of which are assigned to the assignees hereof and hereby expressly incorporated by reference herein.

FIELD

Embodiments of the present disclosure generally relate to door frames for sliding door openings, and in particular, to security features for sliding doors having standard frames or adjustable frames for assembly of the door frames with walls of different thicknesses.

BACKGROUND

Sliding doors system are difficult to incorporate security features, at least in part because they are situated on one side of a wall and do not easily interact with door frames to allow the security features to operate as needed. In addition to the challenges of adding security features to sliding door systems, walls within a building, such as within individual rooms, between rooms, and/or between floors may be of different sizes, and thus, require different specialty door frames.

SUMMARY

As will be described herein, embodiments of the sliding door systems have one or more sliding doors, door frames (e.g., traditional static frames of different sizes for different wall thicknesses or adjustable frames that can be used to fit different wall thicknesses), sliding door hardware (e.g., tracks, wheels, soft closers, stops, or the like), headers, door receivers, a plurality of seals, or the like. The present invention utilizes improvements to the sliding door systems in order allow the systems to provide security features, such as electromagnetic (EMI-RFI) shielding, sound resistance, blast resistance, forced entry and/or ballistic resistance, privacy features, light reduction, fire and/or smoke resistance, or the like. In particular, the present invention provides for the use of the security features with the static or adjustable door frames described herein.

It should be understood that door frames may comprise three (3) portions comprising an upper portion disposed adjacent an upper end of a door opening and two side portions disposed along either edge of the door opening. One side portion is located on one side of the door opening and the opposite side portion is located on the opposite side of the door opening. Each of the door frame portions may be made up of a single segment (e.g., for static door frames of different sizes) or a pair of elongated frame segments (e.g., for adjustable door frames that fit multiple wall thicknesses) of sufficient length to fit the door opening. The frame segments are assembled around the opening edges of wall that form the door opening. With respect to the adjustable door frame segments, a first frame segment may be disposed on the outer side of the door opening (e.g., the side of wall that is normally outside of the door), and second frame segment may be disposed on the inner side of the door opening (e.g., the side of the wall that is normally enclosed by the door). However, in some embodiments the first frame segment may be disposed on the inner side of the door opening and the second frame segment may be disposed on the outer side of the door opening. The frame portions may be secured to each other and the adjoining structure by frame connectors (e.g., clips, tabs, fasteners, and/or the like). A sliding door may be hung conventionally on the inner side or outer side of the door opening using sliding door hardware. The door may be any type of conventional door, any customized door, or the like and made of any material (e.g., wood, metal, plastic, composite, or the like). The first frame segment and the second frame segment may adjust with respect to each other in order in order to extend around the thickness of the door opening to account for different walls having different thicknesses. The segments may be operatively coupled together through the use of one or more segment connectors (e.g., clips, tabs, fasteners, and/or the like).

Regardless, if the door frame a single static door frame or an adjustable door frame, the frames may have one or more caps, a receiver, a header, or the like. The one or more caps (e.g., facia, covers, or the like) may cover at least a portion of the segments and/or the segment connectors that operatively couple the frame segments to the door opening and/or each other. The receiver may be used to receive an edge of the sliding door. The header may be used to receive a top edge of the of the sliding door and/or to conceal the sliding door hardware.

One embodiment of the invention comprises a door system. The door system comprises a door frame operatively coupled with one or more door opening surfaces, sliding door hardware operatively coupled to the one or more door opening surfaces or the door frame, and a door operatively coupled to the sliding door hardware. The door system further comprises a plurality of seals operatively coupled to the door frame or the door, the plurality of seals comprising a first edge seal, a second edge seal, a top edge seal, and a bottom edge seal.

In further accord with embodiments, the plurality of seals comprise seal material made from an electromagnetic compatibility (EMC) material to provide EMC shielding, wherein the EMC material provides electromagnetic interference (EMI) or radio frequency interference (RFI) shielding.

In other embodiments, the door frame is covered by the EMC material or made from the EMC material.

In yet other embodiments, door edges are covered in the EMC material, and the door is covered in EMC material, has hone or more layers of EMC material, or is made from the EMC material.

In still other embodiments, the door frame comprises one or more frame portions comprising one or more frame segments.

In other embodiments, the door frame comprises an adjustable door frame. The adjustable door frame comprises a first frame segment having a first molding flange and a first jamb flange, and a second frame segment having a second molding flange and a second jamb flange. The first frame segment is adjustable with respect to the second frame segment, and at least a portion of the first jamb flange and at least a portion of the second jamb flange overlap.

In further accord with embodiments, the door system further comprises one or more segment connectors extending through the first molding flange, the second molding flange, the first jamb flange, or the second jamb flange and into a portion of a support member.

In other embodiments, the door system further comprises a first molding cap operatively coupled to a first molding flange. The first molding cap comprises a first wall cap leg, a first molding cap face, and a first jamb cap leg operatively coupled to the first molding cap face. A second molding cap is operatively coupled to the second molding flange. The second molding cap comprises a second wall cap leg, a second molding cap face, and a second jamb cap leg operatively coupled to the second molding cap face.

In yet other embodiments, an outer surface of the first jamb cap leg is flush with an outer surface of the first jamb flange, and an outer surface of the second jamb cap leg is flush with an outer surface of the second jamb flange.

In still other embodiments, the first jamb cap leg overlaps the first jamb flange and the second jamb flange, and wherein an end of the first jamb cap leg is adjacent an end of the second jamb cap leg.

In other embodiments, the first jamb flange or the second jamb flange are operatively coupled to each other or a support member using the one or more segment connectors; and wherein the first jamb cap leg or the second jamb cap leg conceal the one or more segment connectors.

In further accord with embodiments, the first jamb flange overlaps a portion of the second jamb flange. An end of the second jamb cap leg is adjacent to an end of the first jamb flange, and wherein an outer surface of the first jamb flange and an outer surface of the second jamb cap leg are flush.

In other embodiments, the first frame segment comprises one or more proximal jamb portions, and one or more distal jamb portions operatively coupled to the one or more proximal jamb portions. The one or more proximal jamb portions adjacent to the one or more distal jamb portions form one or for jamb channels that receive at least a portion of the second jamb flange.

In yet other embodiments, the door system further comprises a first molding cap operatively coupled to a first molding flange of the door frame, and a second molding cap operatively coupled to a second molding flange of the door frame. The first molding cap or the second molding cap has a seal channel formed therein that is configured to receive the first edge seal or the second edge seal.

In still other embodiments, the plurality of seals provide one or more of EMC shielding, sound abatement, light abatement, fire or smoke abatement, or air flow abatement.

In other embodiments, the first edge seal is operatively coupled adjacent to a first door edge, to a first frame portion of the door frame, or within a receiver channel formed by a receiver that is operatively coupled to the first frame portion and configured to receive the first edge of the door. The second edge seal is operatively coupled adjacent to a second door edge or to a second frame portion of the door frame. The top edge seal is operatively coupled adjacent to an upper edge of the door or a header that is operatively coupled to a door frame or wall and the header that is configured to receive the upper edge of the door. The bottom seal is operatively coupled adjacent to a bottom edge of the door or to a floor.

In further accord with embodiments, the door system further comprises a receiver comprising one or more walls forming a receiver channel. The first molding flange of the door frame is operatively coupled to the receiver, and the receiver channel receives a first side edge of the door.

In other embodiments, the door frame further comprises a header. The header comprises a header mount, a header body operatively coupled to the header mount, and a header cap operatively coupled to the header mount or the header body. The header mount, the header body, or the header cap form a header channel, and the header channel receives an upper edge of the door.

Another embodiment is a door system comprising an adjustable door frame comprising three or more portions. Each of the portions comprise a first frame segment having a first molding flange and a first jamb flange, and a second frame segment having a second molding flange and a second jamb flange. The first frame segment is adjustable with respect to the second frame segment and at least a portion of the first jamb flange and at least a portion of the second jamb flange overlap. The adjustable door frame is operatively coupled to door opening surfaces. The first frame segment or the second frame segment is covered in EMC material or made from the EMC material. The door system further comprises sliding door hardware operatively coupled to a wall or the adjustable door frame. Moreover, a door is operatively coupled to the sliding door hardware. The door edges are covered in the EMC material and door faces are covered in the EMC material or have a layer of EMC material. The door system further comprises a plurality of seals operatively coupled to the door frame or the door, the plurality of seals made from the EMC material. The plurality of seals comprise a first edge seal adjacent a first edge of the door, a second edge seal adjacent a second edge of the door, a top edge seal adjacent an upper edge of the door, and a bottom edge seal adjacent a lower edge of the door.

Another embodiment of the invention comprises a method. The method comprises adjusting a first frame segment with respect to a second frame segment based on a width of a wall at a door opening. The first frame segment comprises a first molding flange and a first jamb flange. The second frame segment comprises a second molding flange and a second jamb flange. At least a portion of the first jamb flange and at least a portion of the second jamb flange overlap. The method further comprises securing the first frame segment and the second frame segment to the wall at the door opening.

To the accomplishment the foregoing and the related ends, the one or more embodiments comprise the features hereinafter described and particularly pointed out in the claims. The following description and the annexed drawings set forth certain illustrative features of the one or more embodiments. These features are indicative, however, of but a few of the various ways in which the principles of various embodiments may be employed, and this description is intended to include all such embodiments and their equivalents.

BRIEF DESCRIPTION OF THE DRAWINGS

Having thus described embodiments of the invention in general terms, reference will now be made to the accompanying drawings.

Figure 1A:
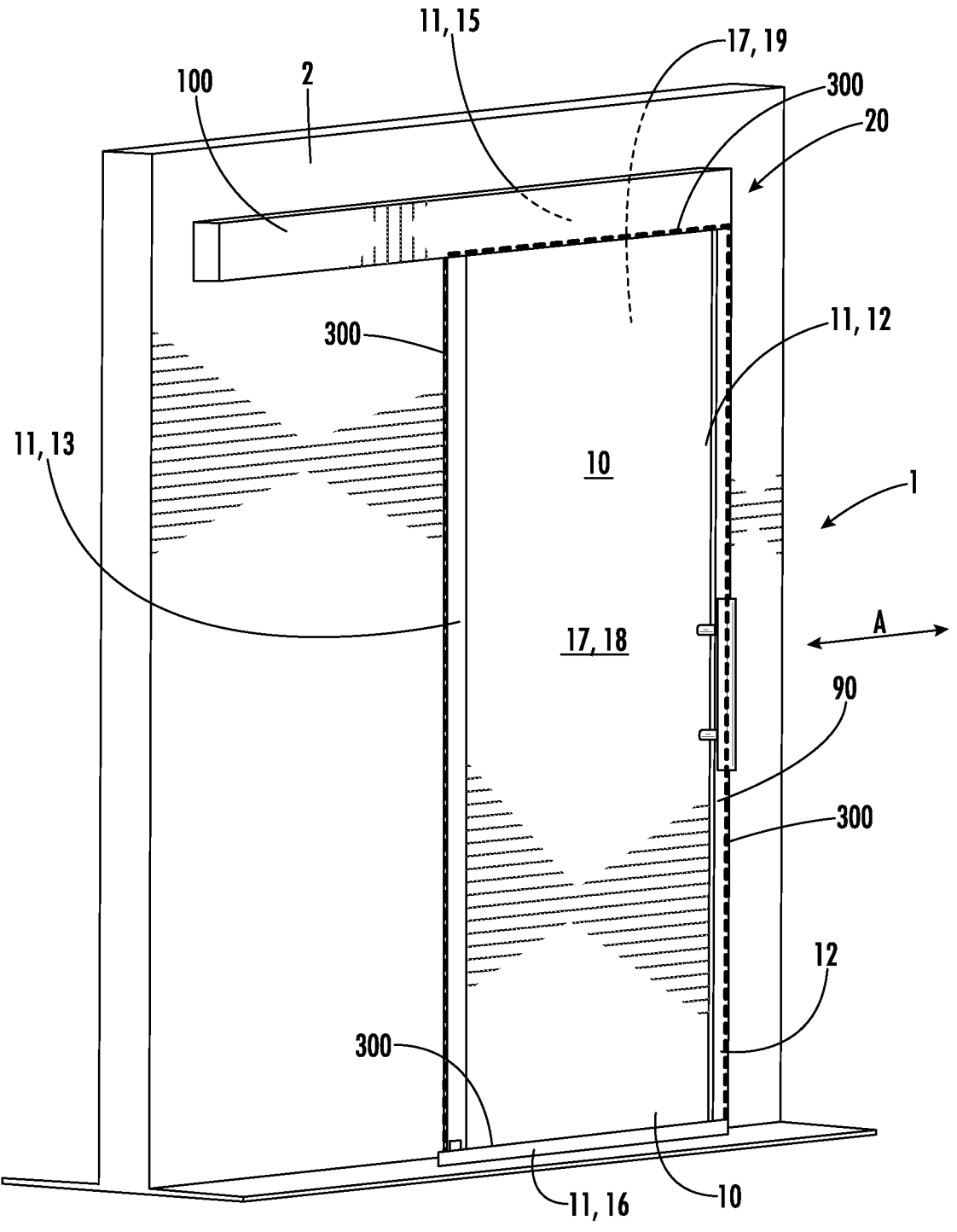

FIG. 1A is front perspective view of one side of the sliding door system, in accordance with some embodiments of the present disclosure.

Figure 1B:
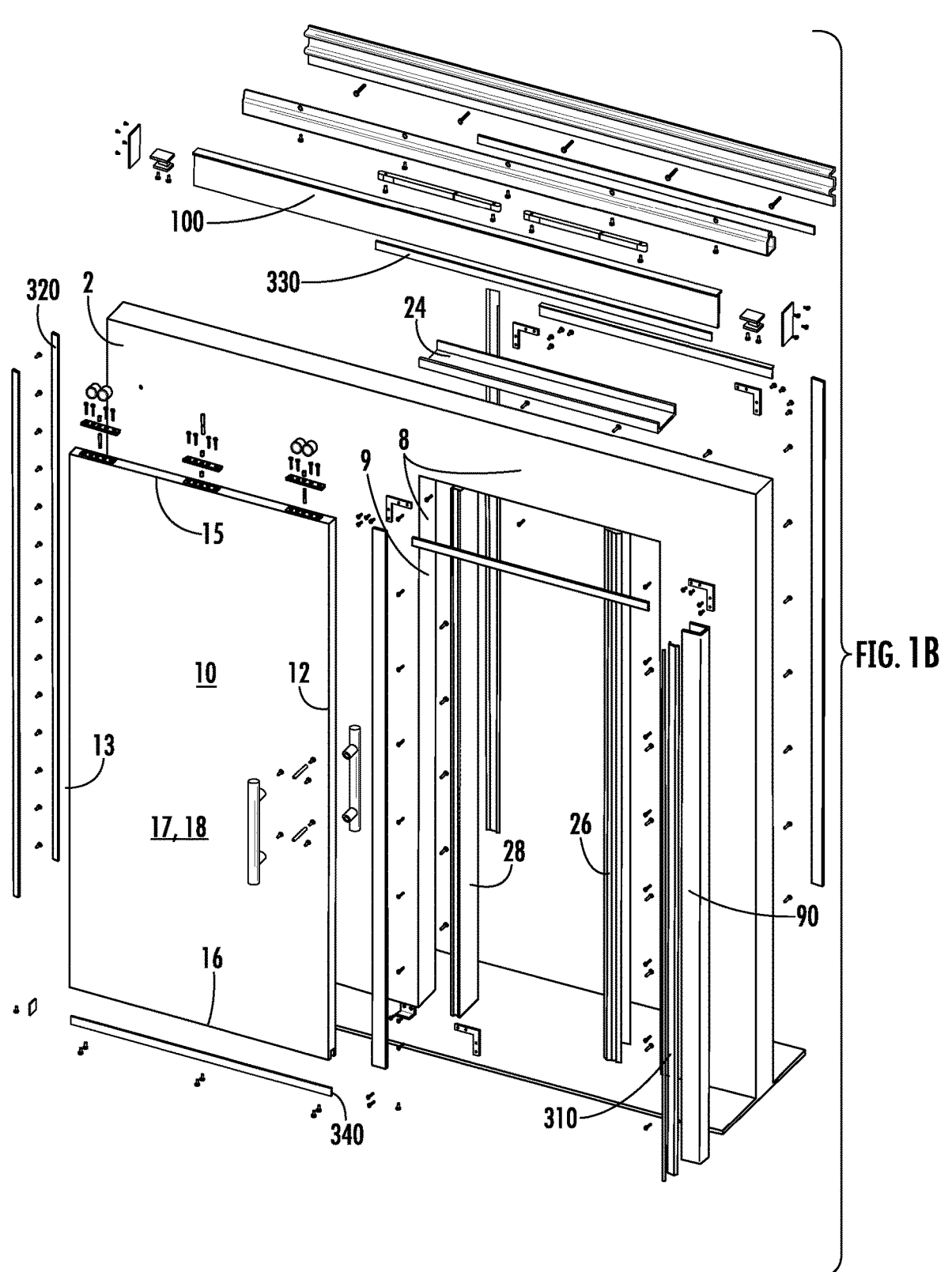

FIG. 1B is a front exploded perspective view of one side of the sliding door system, in accordance with some embodiments of the present disclosure.

Figure 1C:
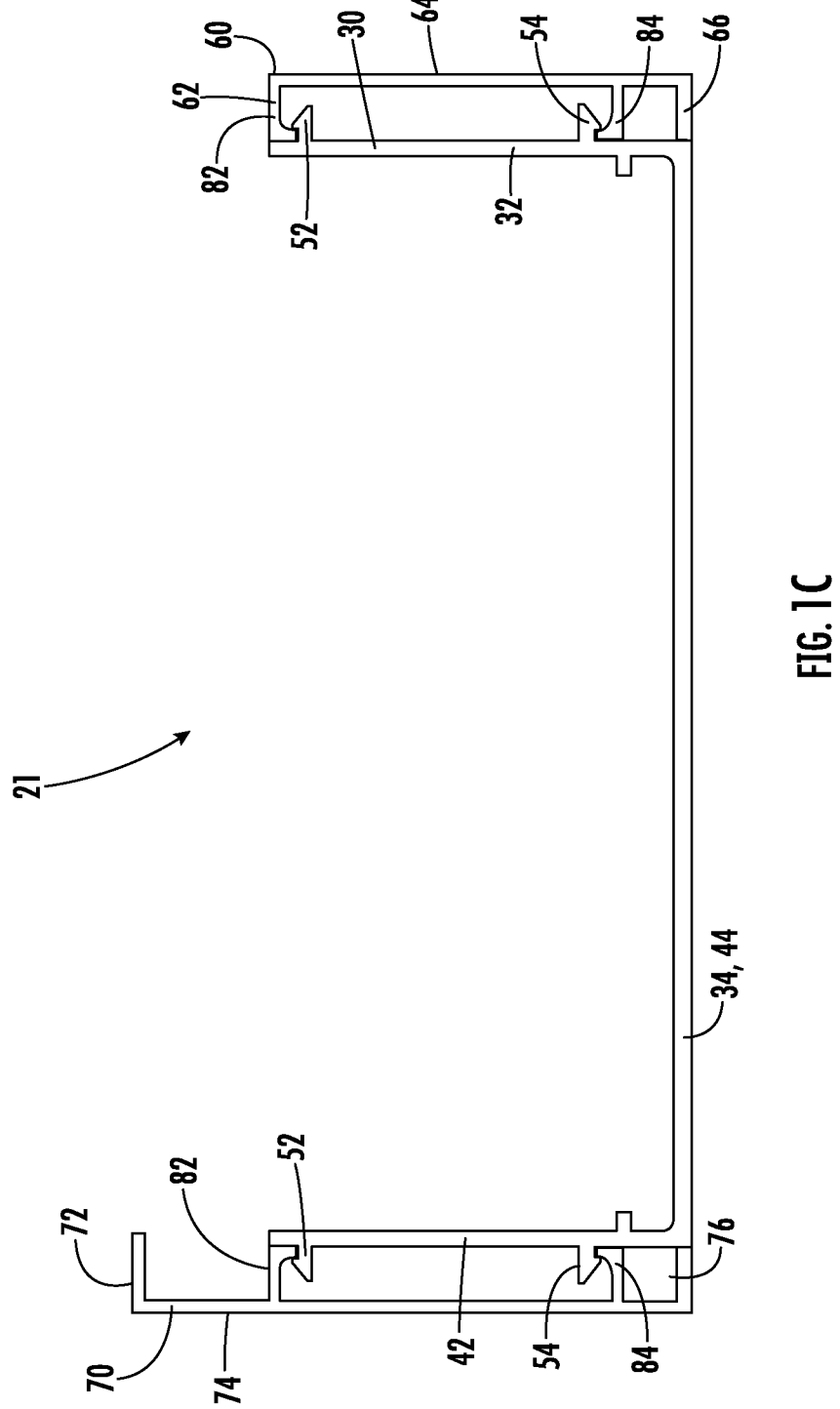

FIG. 1C illustrates a single segment door frame for the sliding door system, in accordance with some embodiments of the present disclosure.

Figure 2:
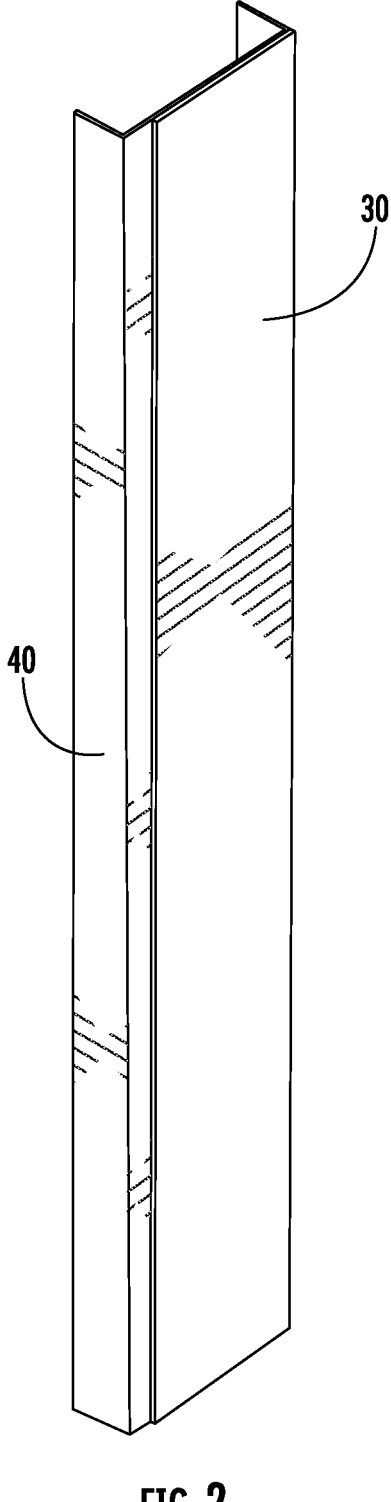

FIG. 2 is a perspective view of a portion of the adjustable door frame, in accordance with some embodiments of the present disclosure.

Figure 3A:
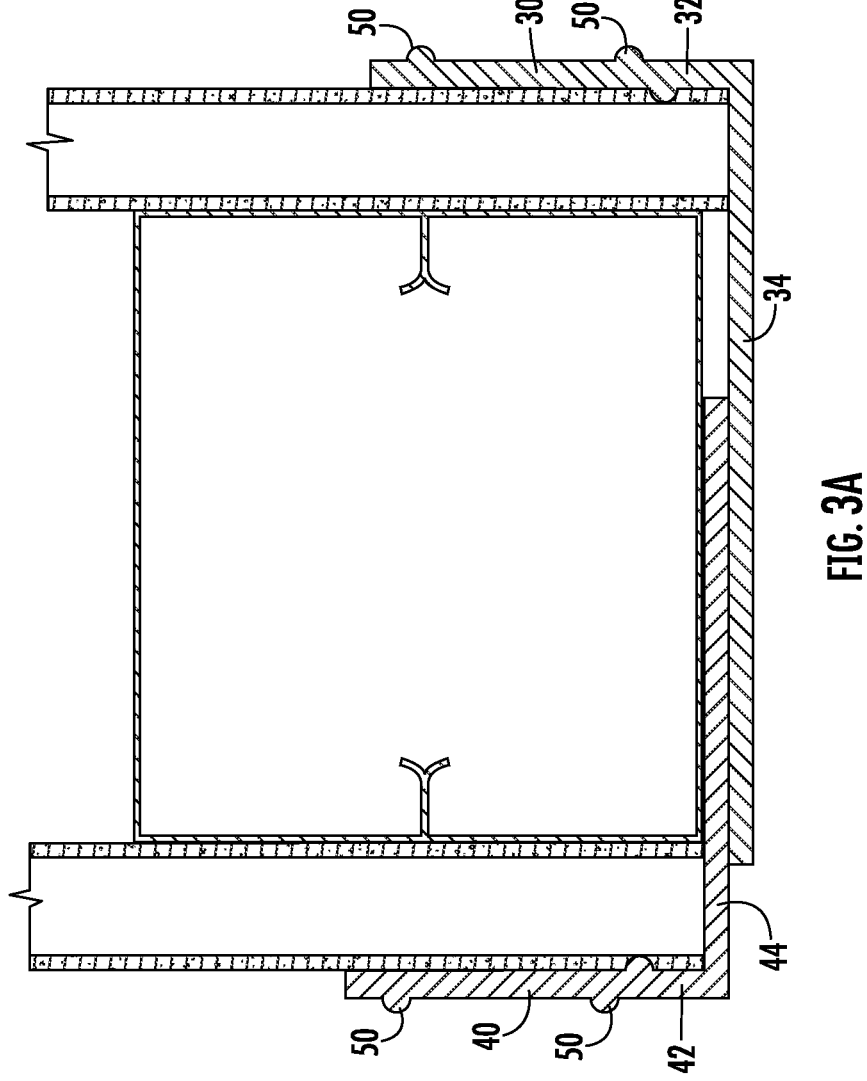

FIG. 3A illustrates a cross-sectional view of the adjustable door frame installed to metal studs, in accordance with some embodiments of the present disclosure.

Figure 3B:
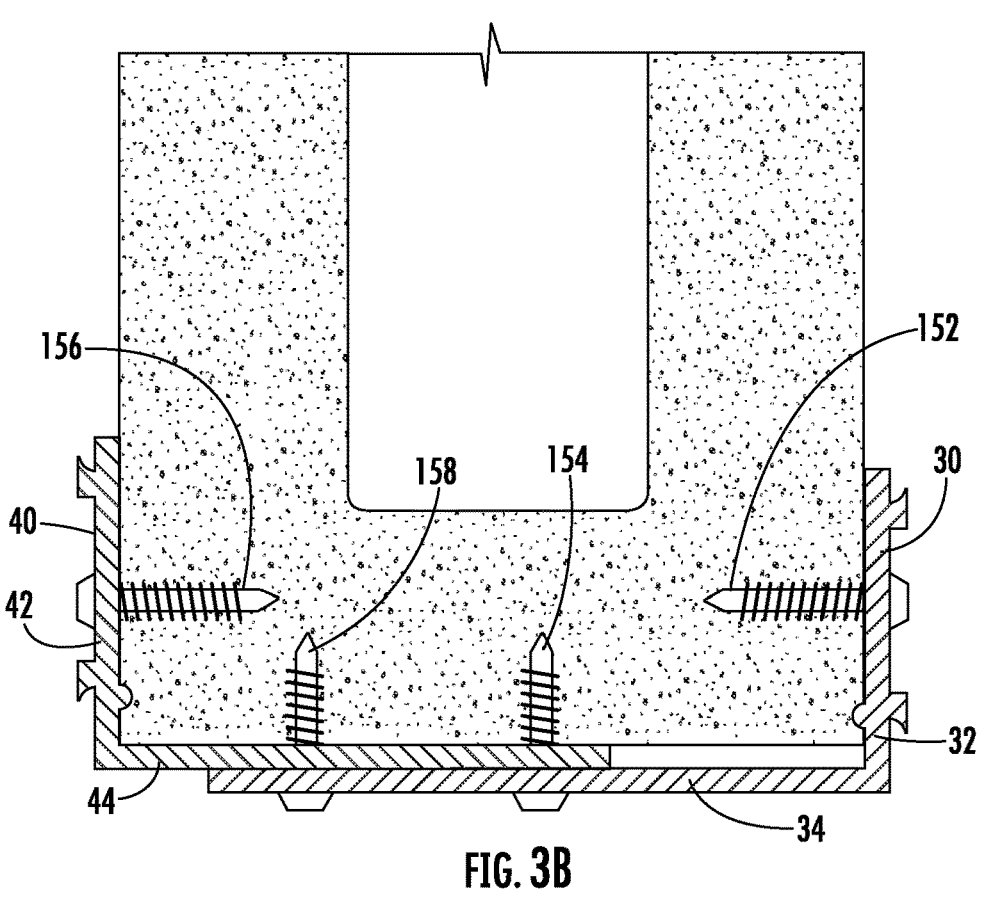

FIG. 3B illustrates a cross-sectional view of the adjustable door frame installed to a masonry wall, in accordance with some embodiments of the present disclosure.

Figure 3C:
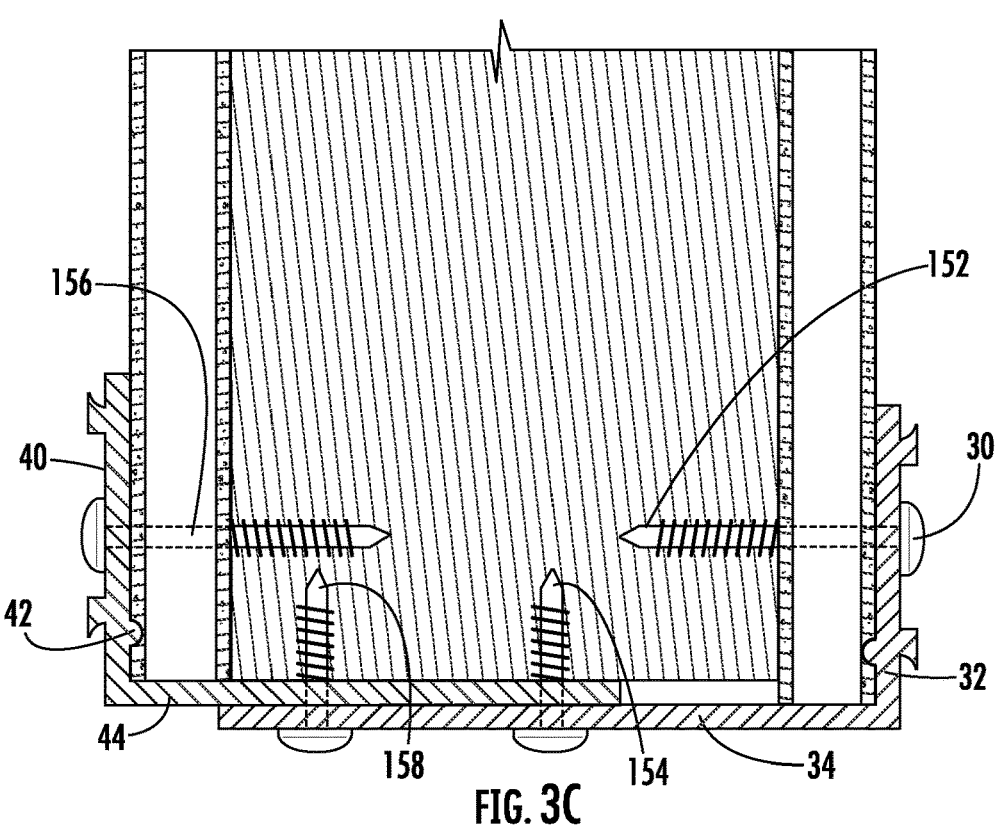

FIG. 3C illustrates a cross-sectional view of the adjustable door frame installed to wood studs, in accordance with some embodiments of the present disclosure.

Figure 4:
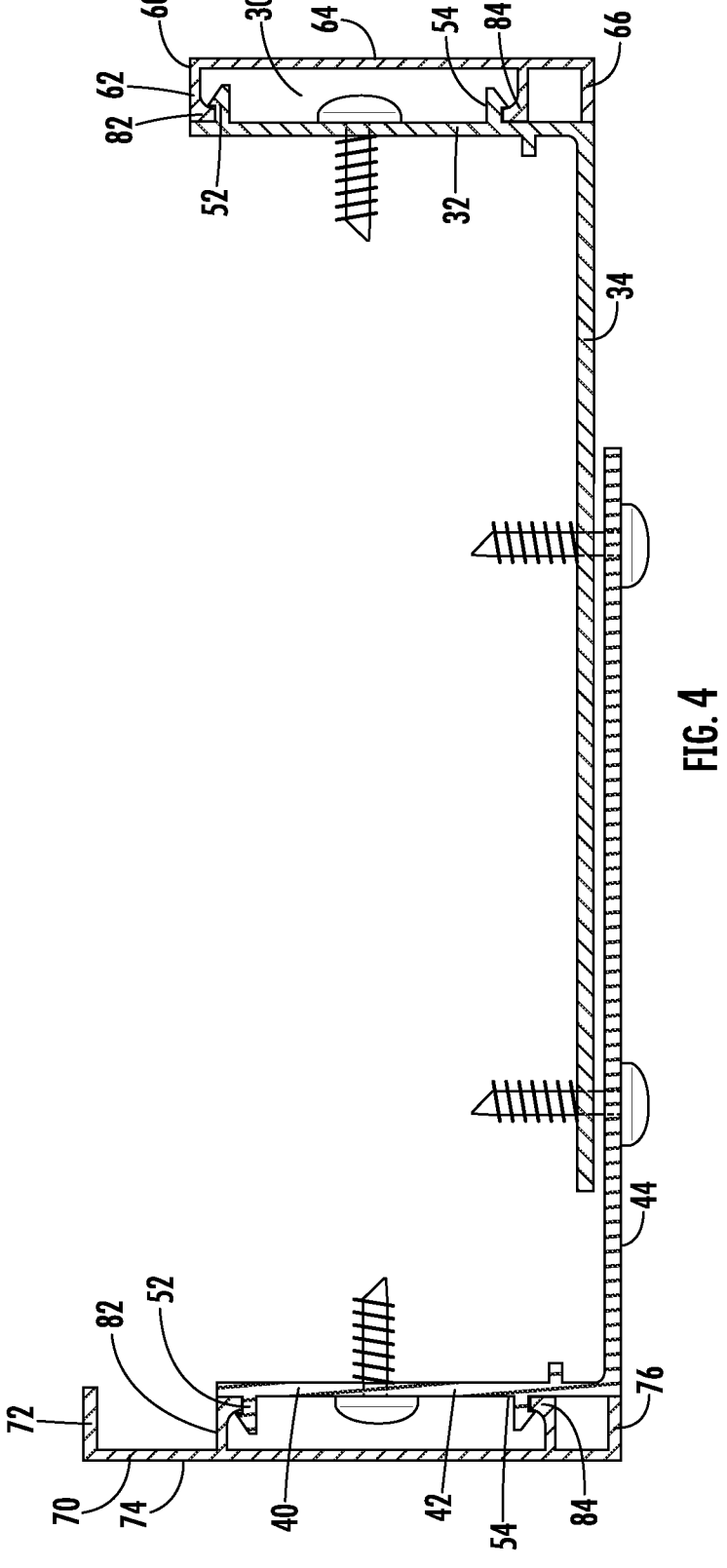

FIG. 4 illustrates a cross-sectional view of the adjustable door frame having caps, in accordance with some embodiments of the present disclosure.

Figure 5:
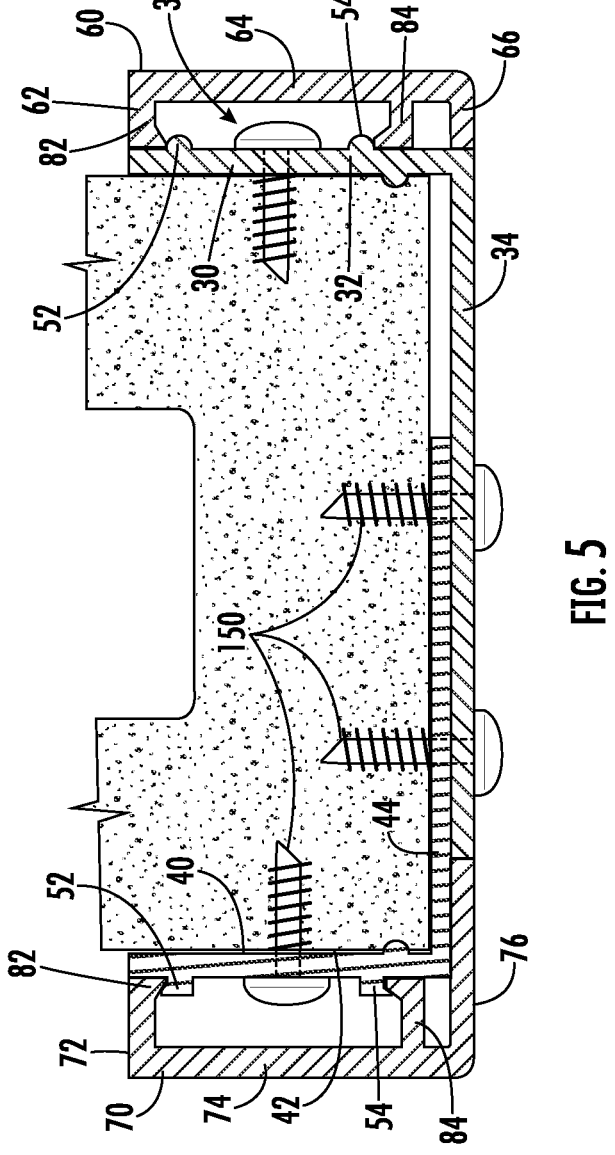

FIG. 5 illustrates a cross-sectional view of the adjustable door frame having caps that are flush with the door frame segments, in accordance with some embodiments of the present disclosure.

Figure 6:
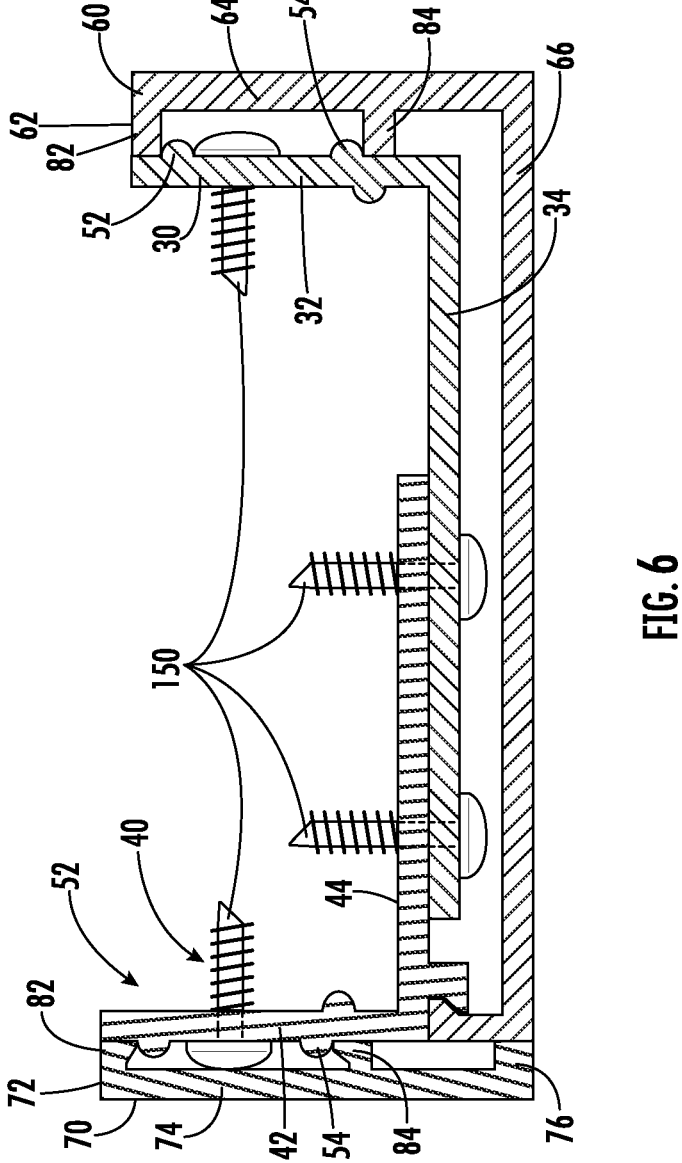

FIG. 6 illustrates a cross-sectional view of the adjustable door frame having caps that cover the segment connectors, in accordance with some embodiments of the present disclosure.

Figure 7:
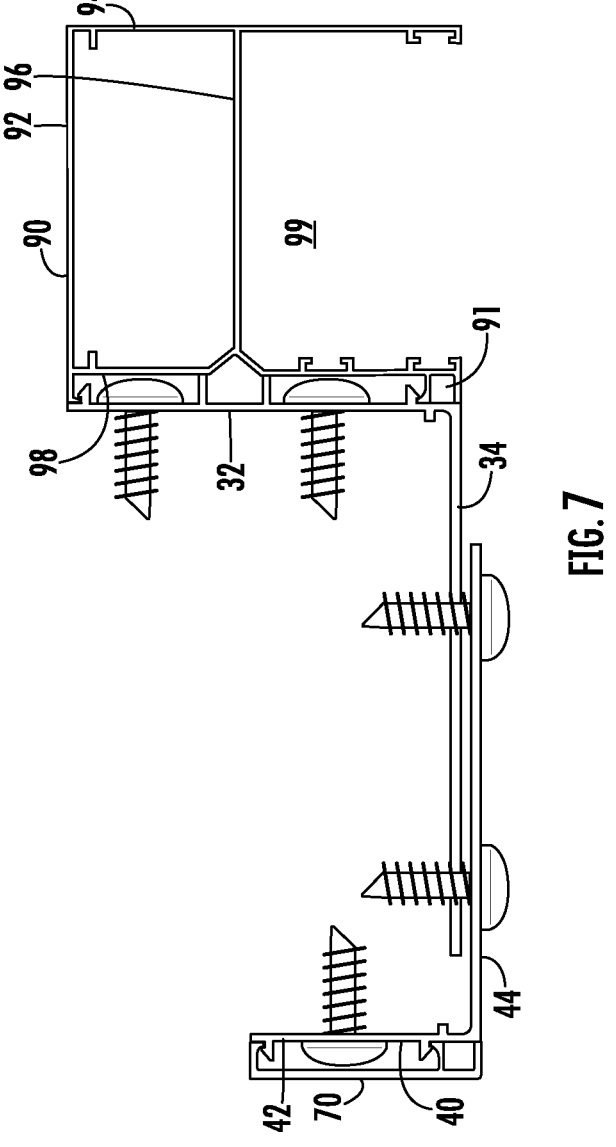

FIG. 7 illustrates a cross-sectional view of the adjustable door frame having a receiver, in accordance with some embodiments of the present disclosure.

Figure 8:
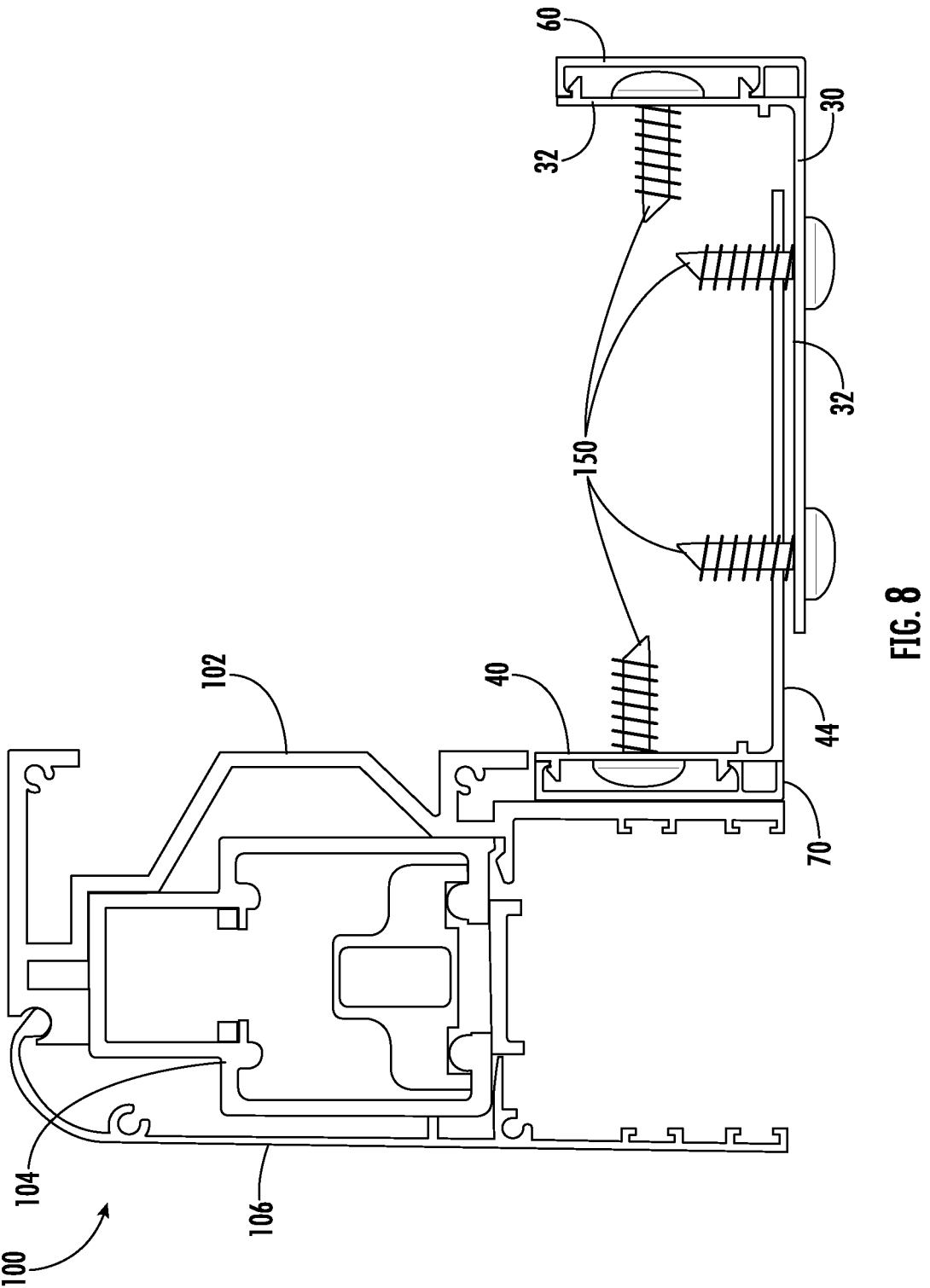

FIG. 8 illustrates a cross-sectional view of the adjustable door frame having a header, in accordance with some embodiments of the present disclosure.

Figure 9:
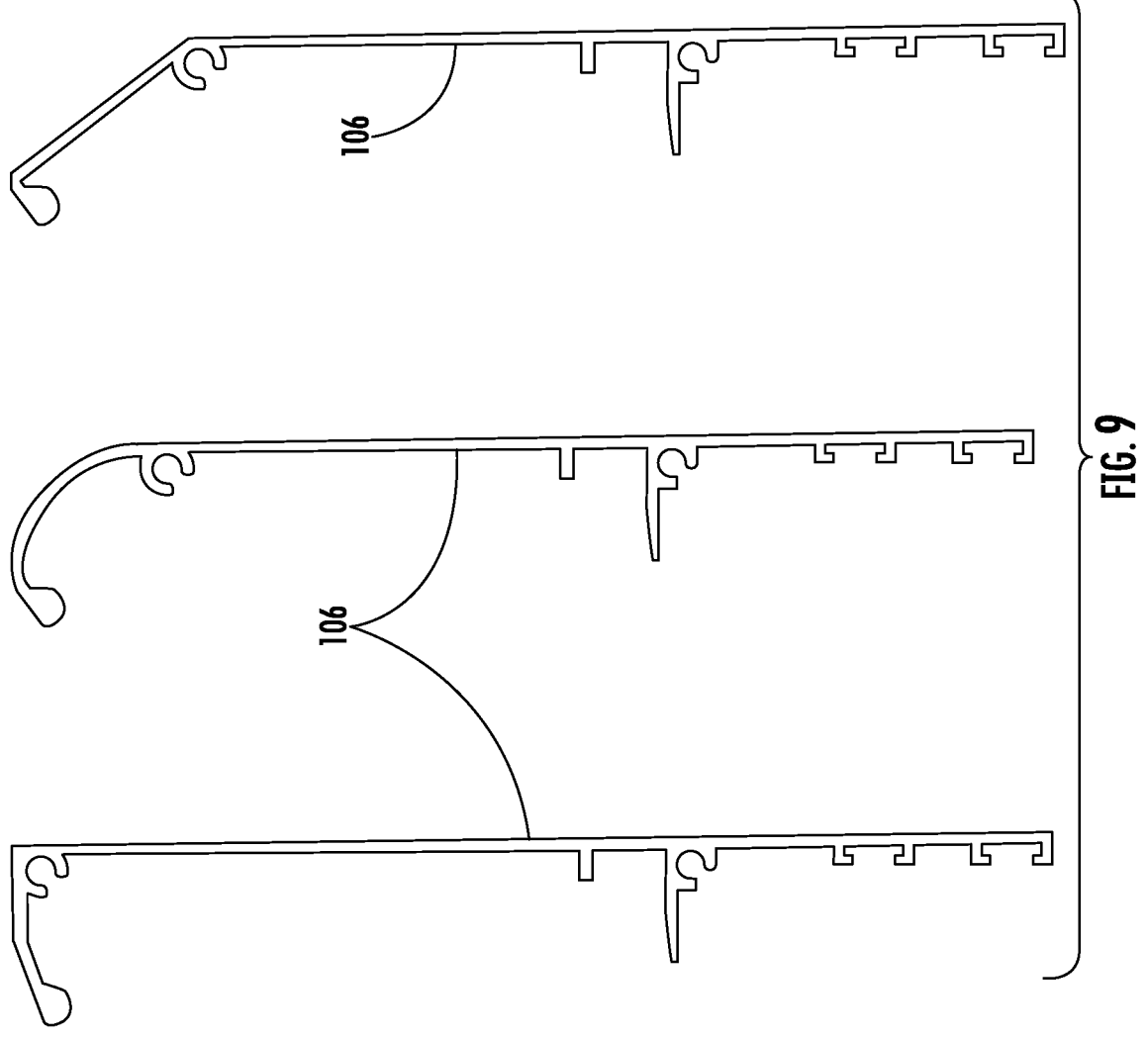

FIG. 9 illustrates cross-sectional views different header caps, in accordance with some embodiments of the present disclosure.

Figure 10:
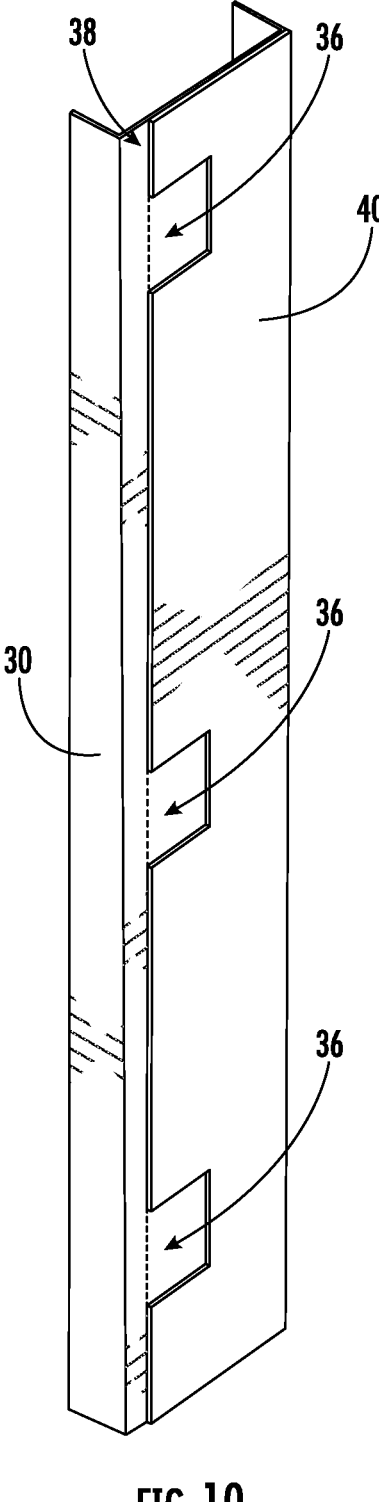

FIG. 10 illustrates a cross-sectional view of the adjustable door frame having an one or more segment channels, in accordance with some embodiments of the present disclosure.

Figure 11A:
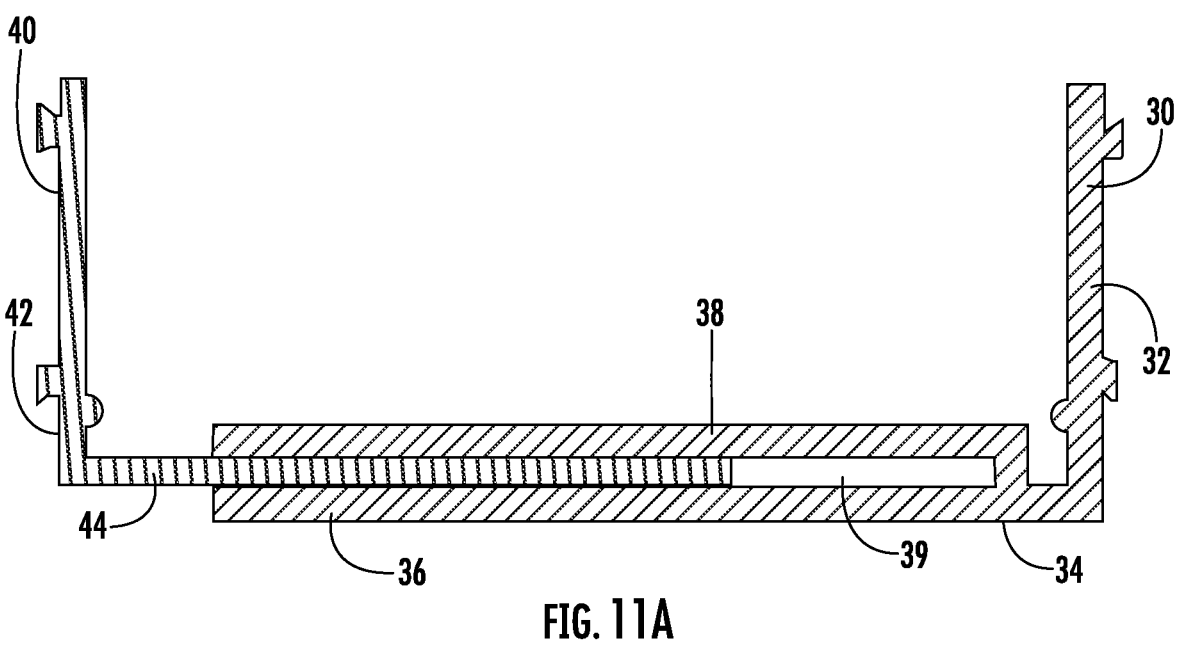

FIG. 11A illustrates a cross-sectional view of the adjustable door frame having the one or more segment channels, in accordance with some embodiments of the present disclosure.

Figure 11B:
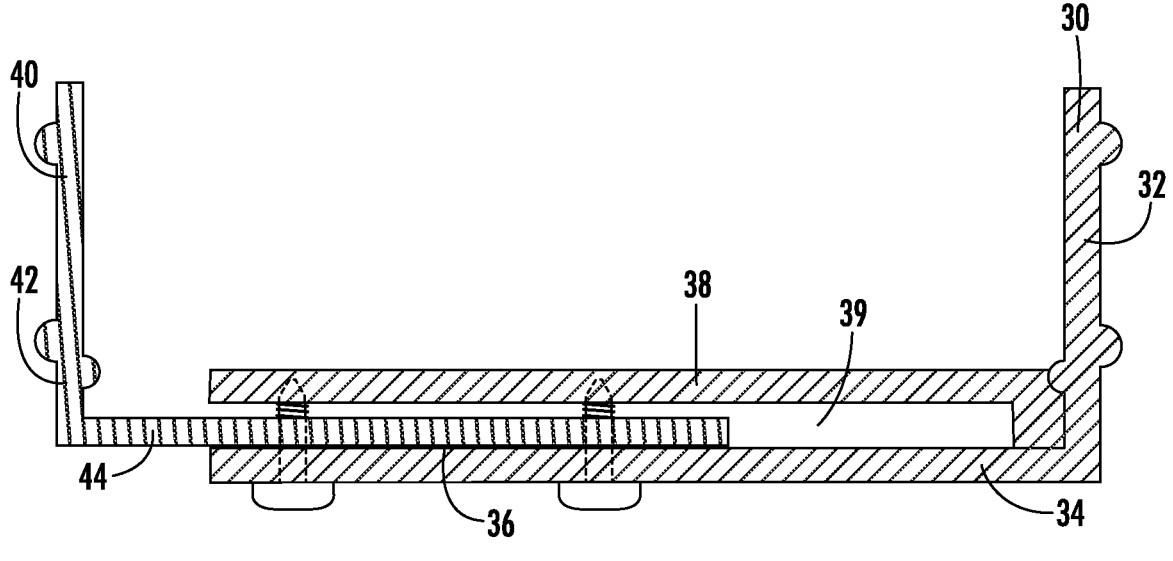

FIG. 11B illustrates a cross-sectional view of the adjustable door frame having the one or more segment channels, in accordance with some embodiments of the present disclosure.

Figure 12A:
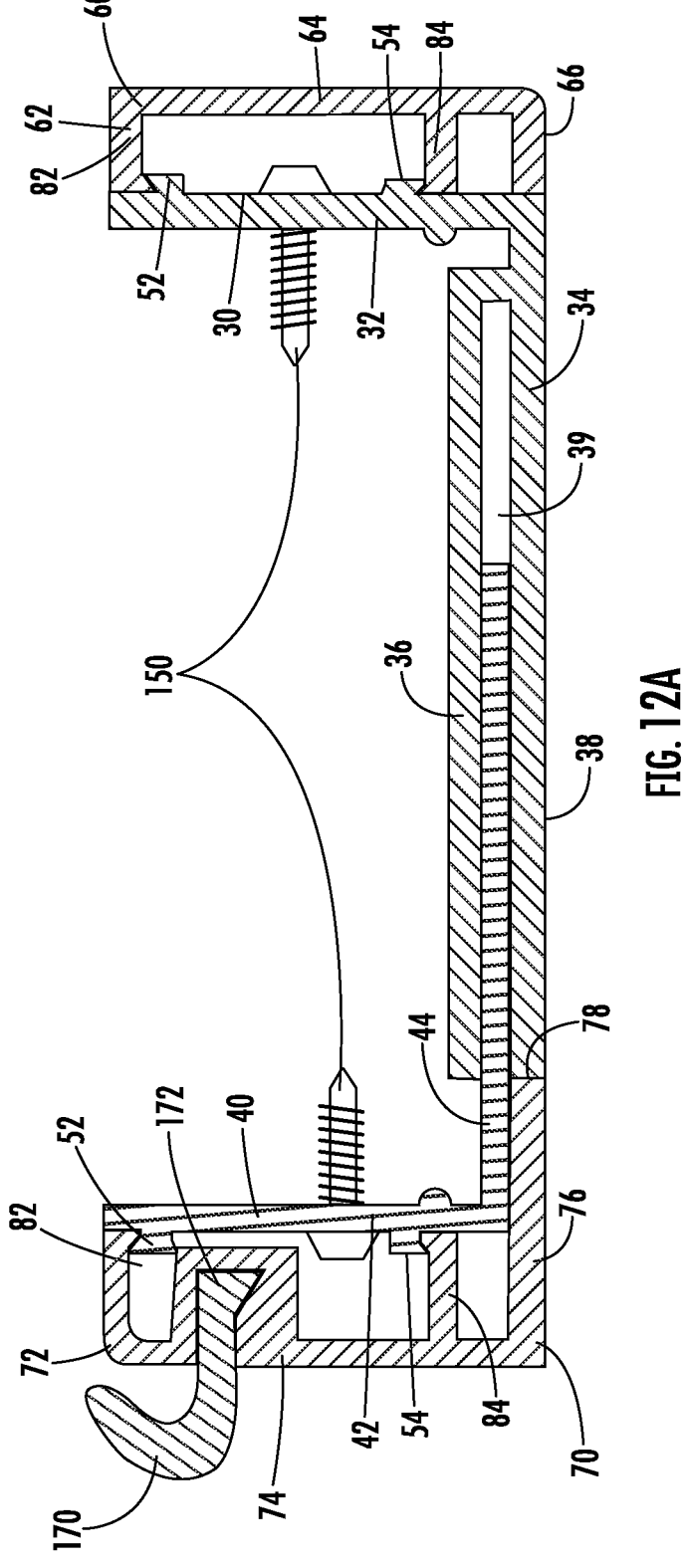

FIG. 12A illustrates a cross-sectional view of the adjustable door frame having the one or more segment channels and cap with a seal, in accordance with some embodiments of the present disclosure.

Figure 12B:
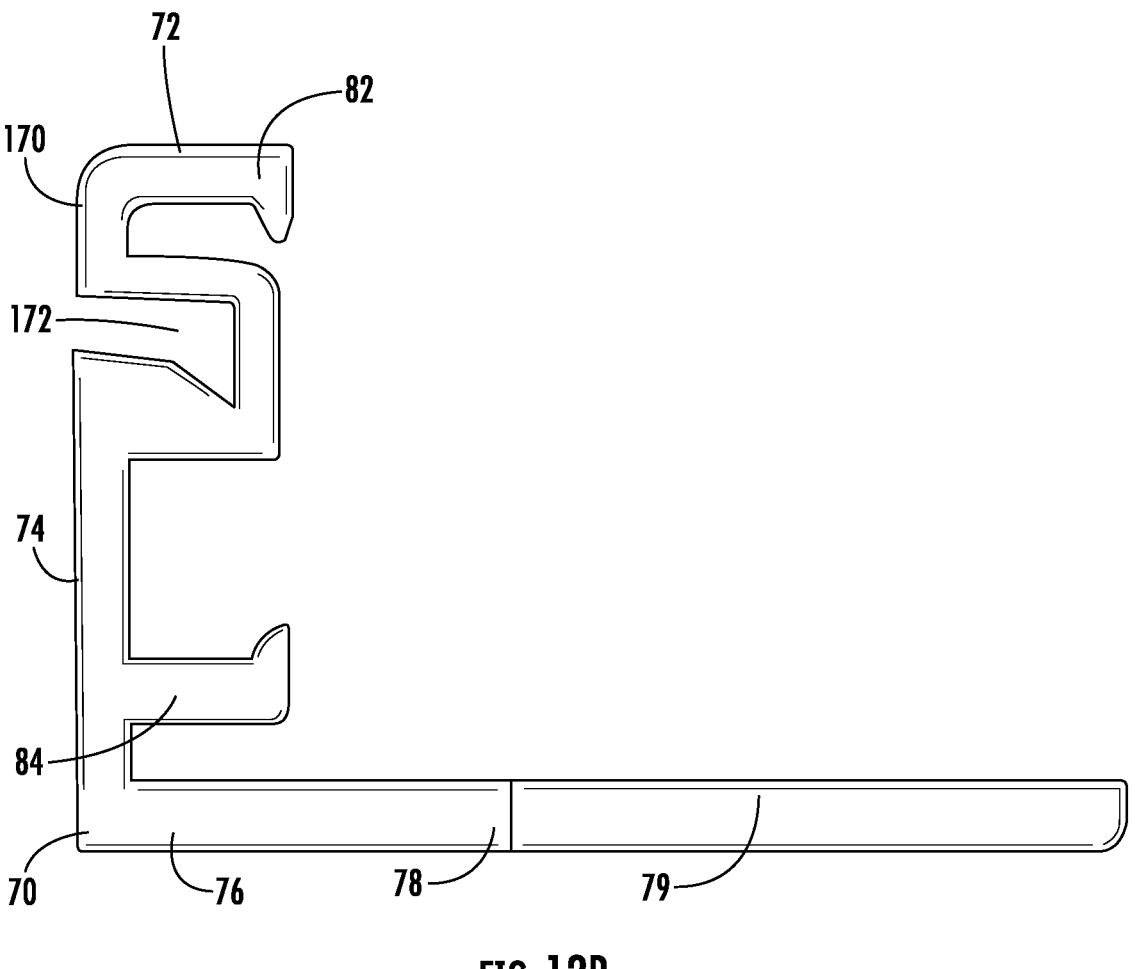

FIG. 12B illustrates a cross-sectional view of the cap with a seal channel, in accordance with some embodiments of the present disclosure.

Figure 13A:
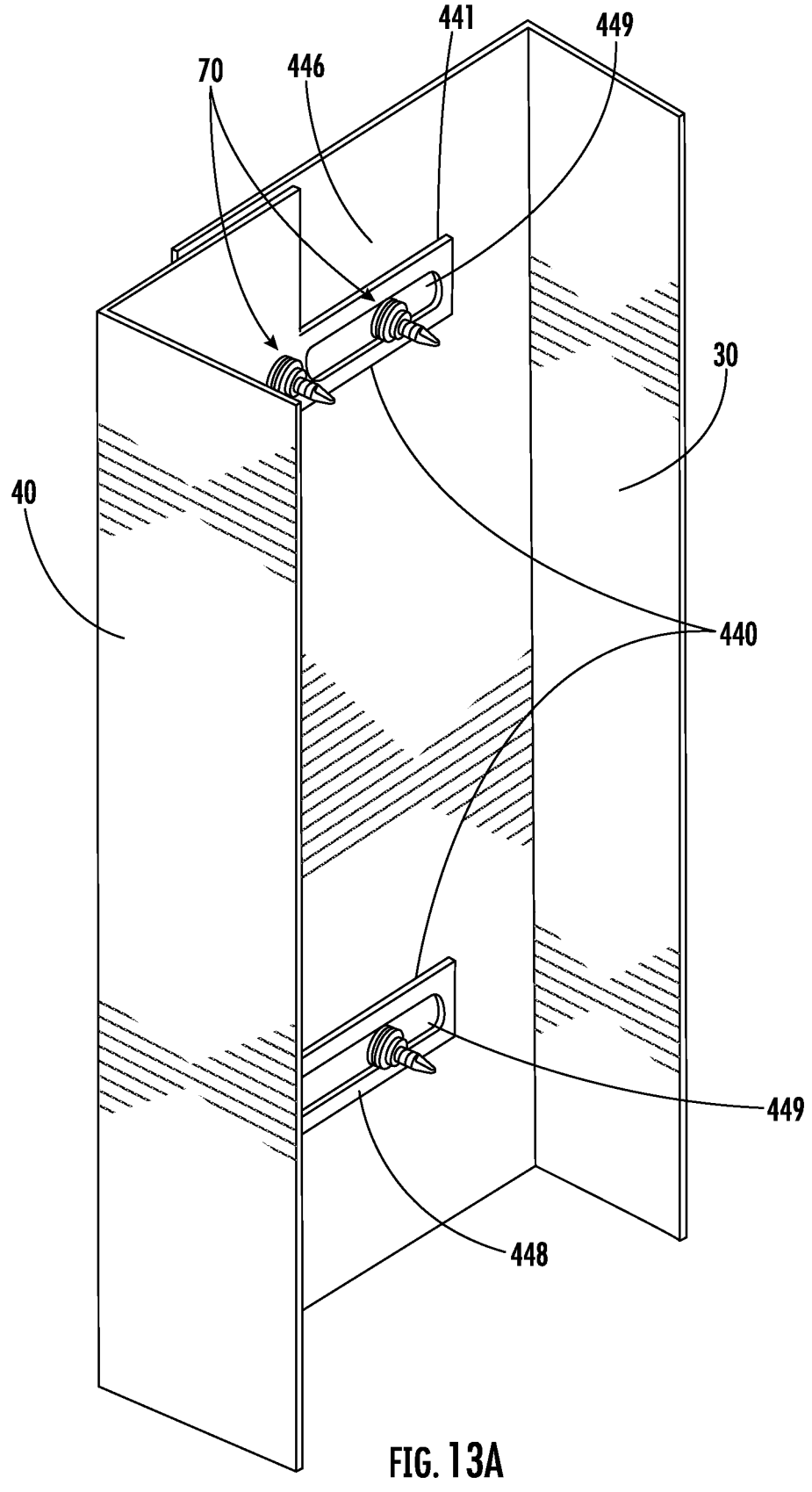

FIG. 13A is a perspective view of a portion of the door frame, in accordance with some embodiments of the disclosure.

Figure 13B:
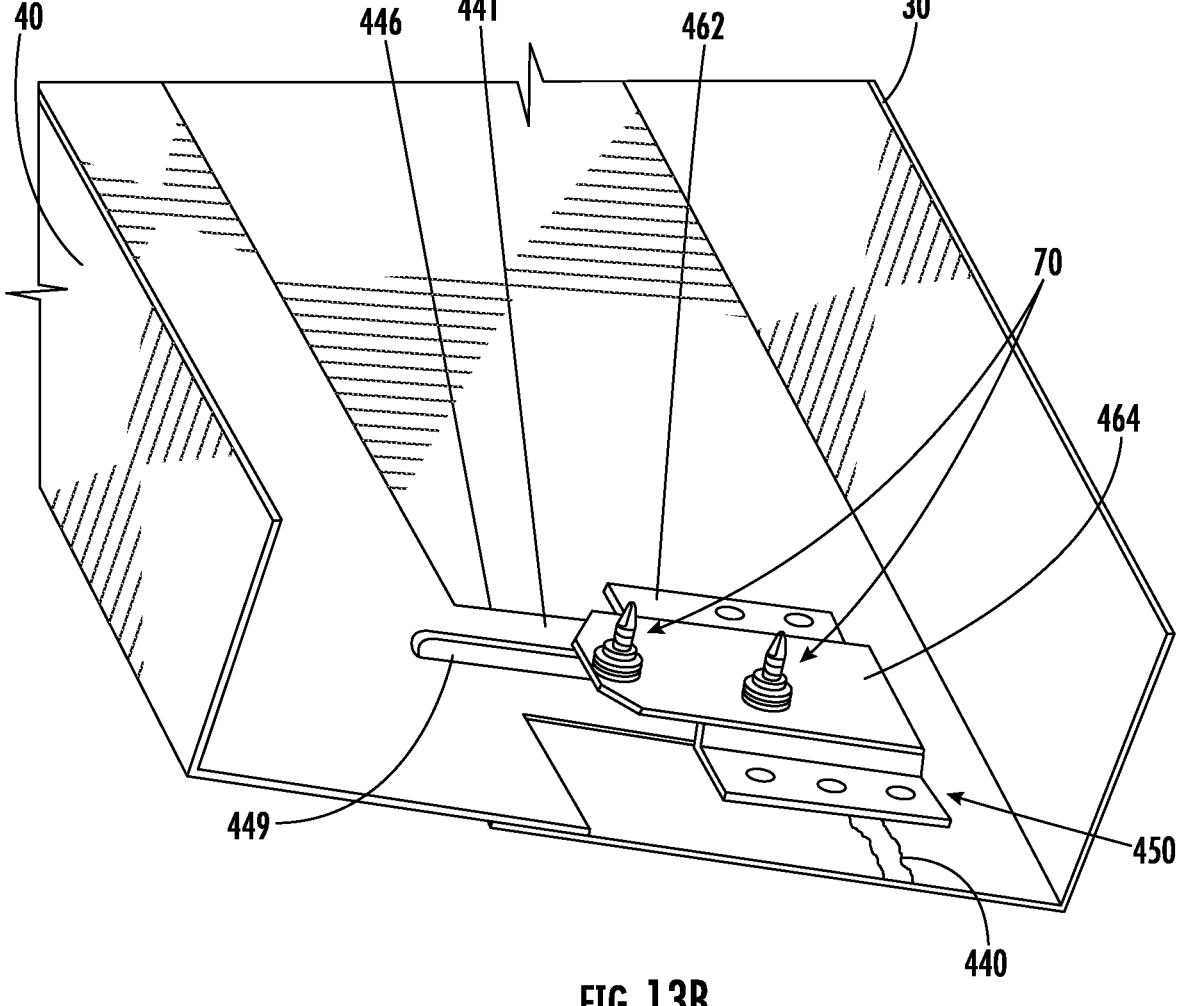

FIG. 13B is a bottom perspective view of a portion of the door frame, in accordance with some embodiments of the disclosure.

Figure 14A:
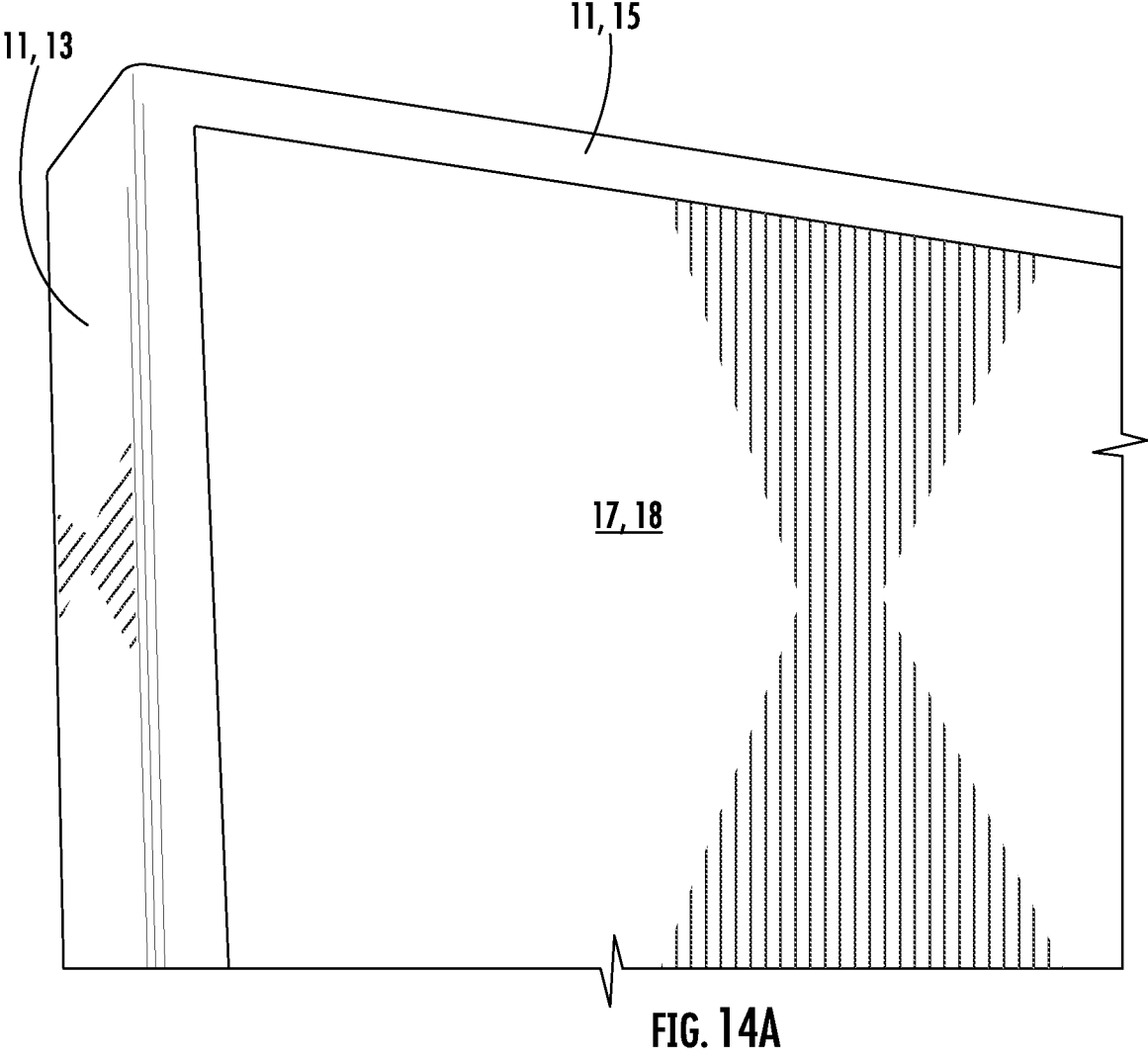

FIG. 14A illustrates a perspective view of a door having one or more security features on the edges of the door, in accordance with some embodiments of the present disclosure.

Figure 14B:
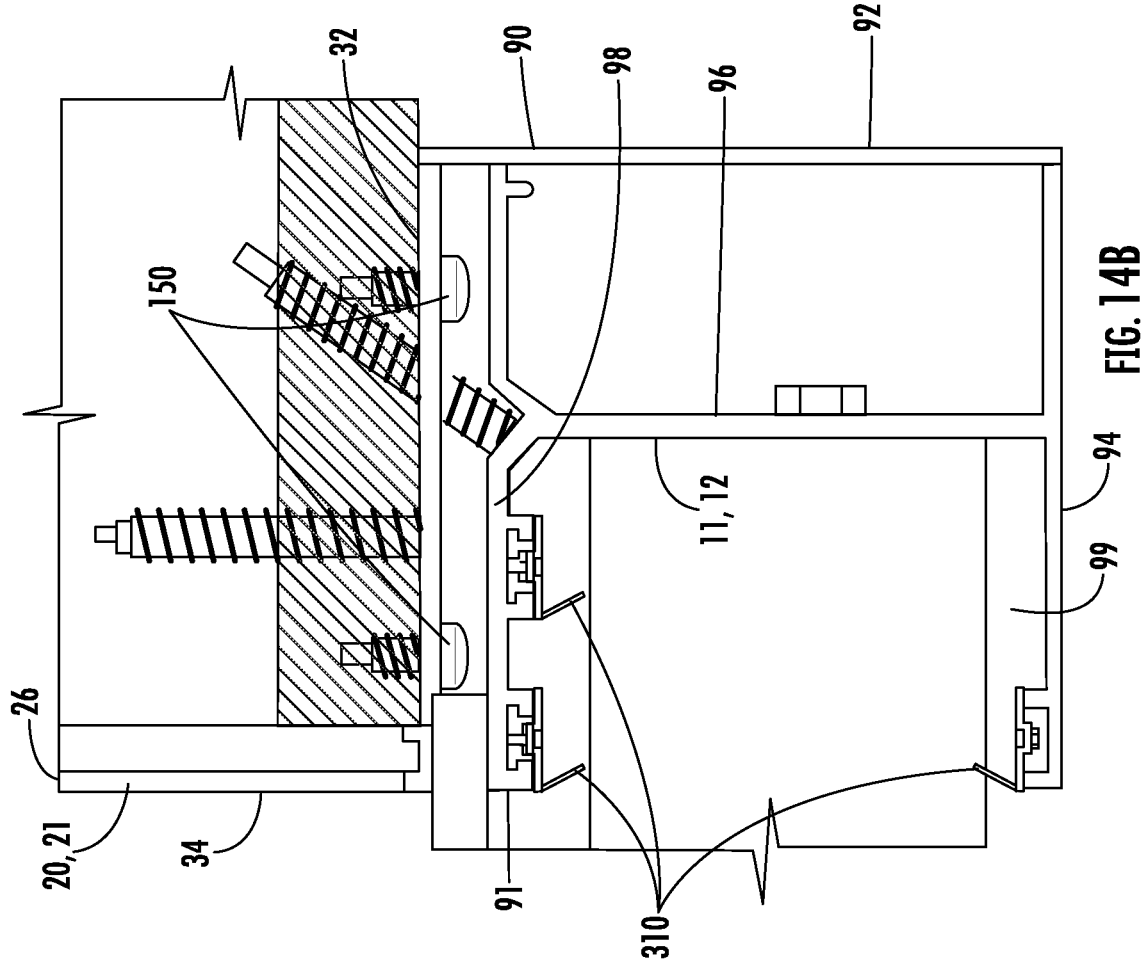

FIG. 14B illustrates a cross-sectional view of a receiver having one or more security features, in accordance with some embodiments of the present disclosure.

Figures 15A, 15B:
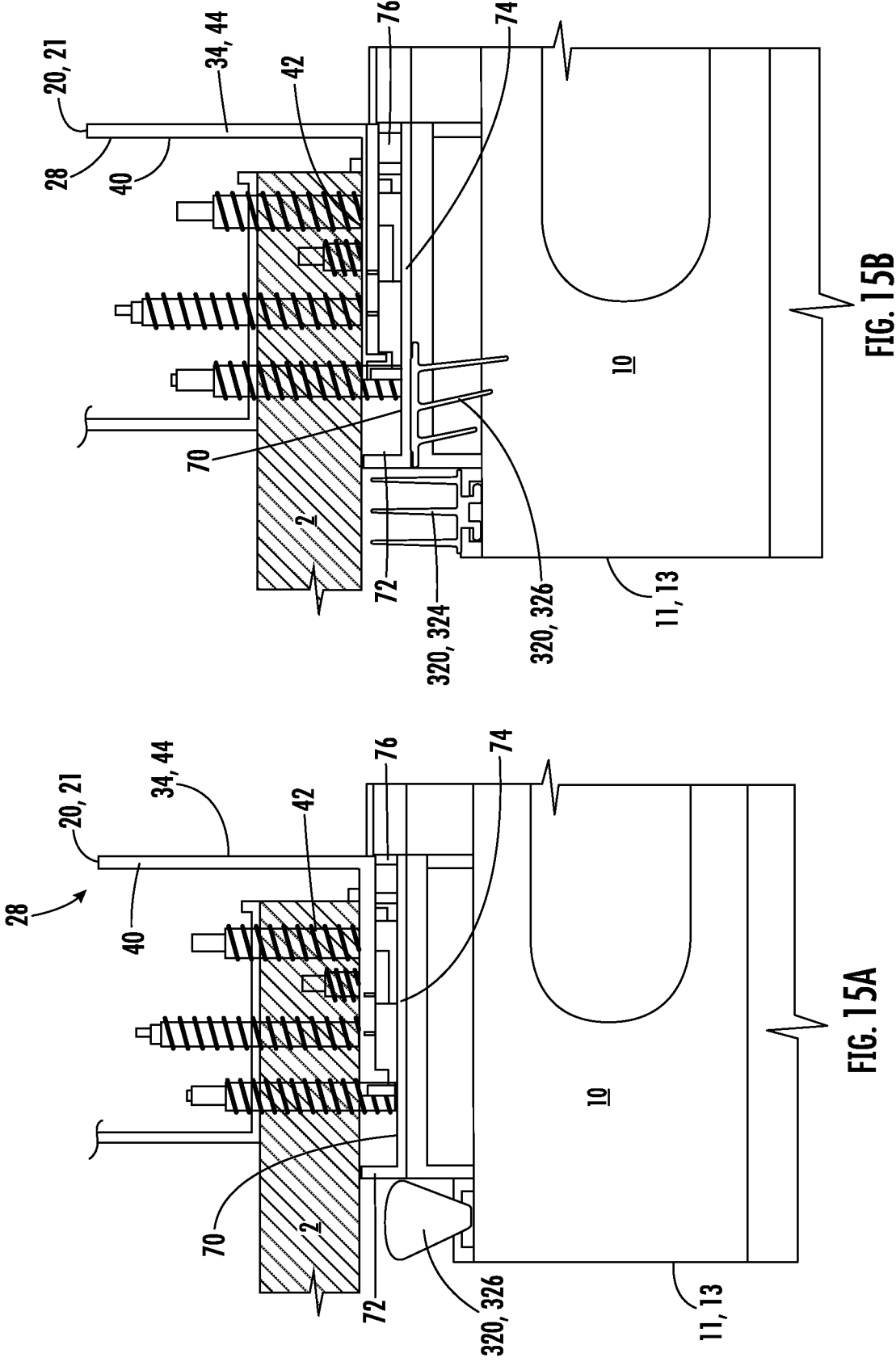

FIG. 15A illustrates a cross-sectional view of a door frame and sliding door with a seal, in accordance with some embodiments of the present disclosure.

FIG. 15B illustrates a cross-sectional view of a door frame and sliding door with a seal, in accordance with some embodiments of the present disclosure.

Figures 16A, 16B:
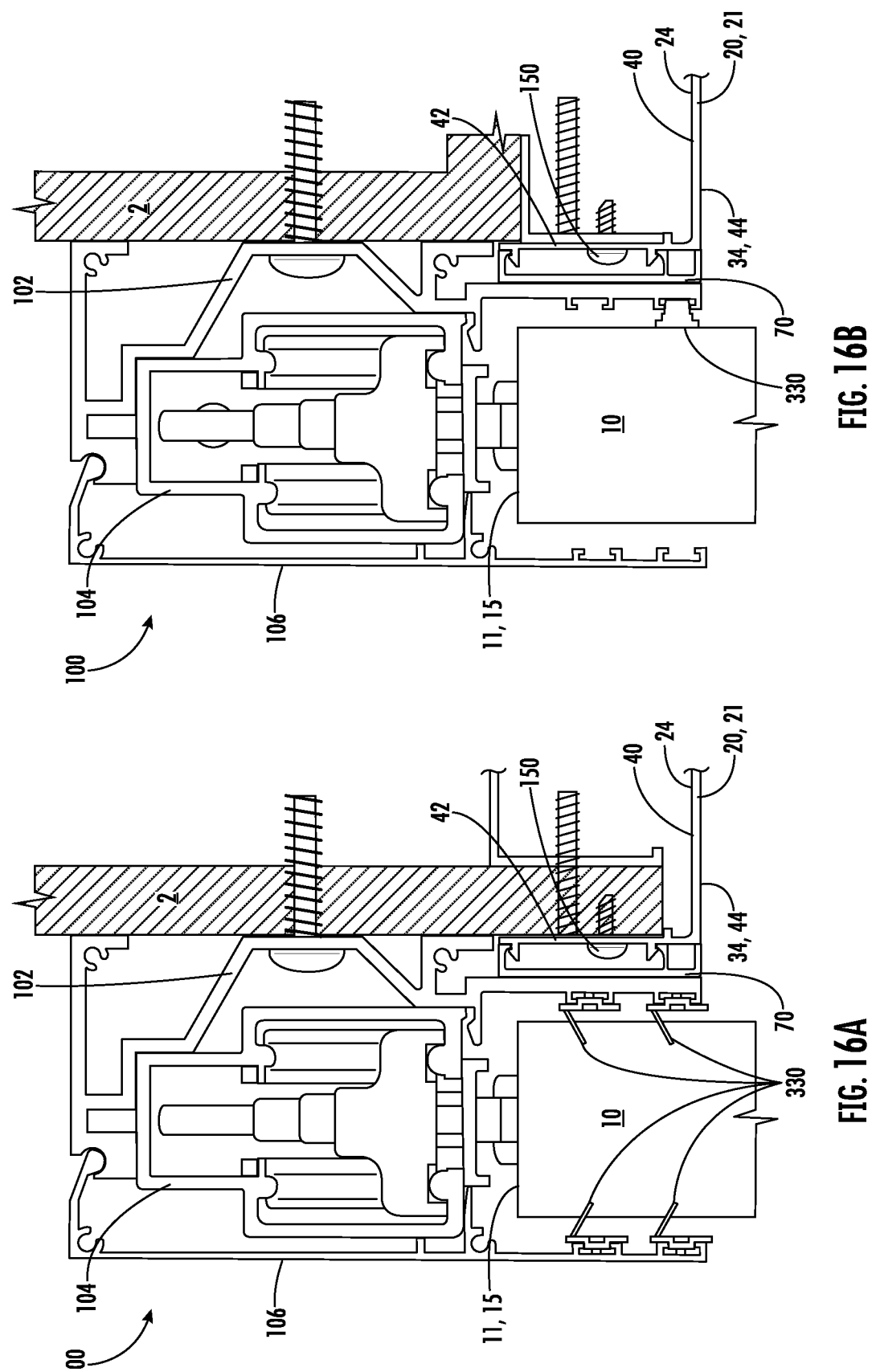

FIG. 16A illustrates a cross-sectional view of a header, door frame, and sliding door with one or more seals, in accordance with some embodiments of the present disclosure.

FIG. 16B illustrates a cross-sectional view of a header, door frame, and sliding door with a seal, in accordance with some embodiments of the present disclosure.

Figure 17A:
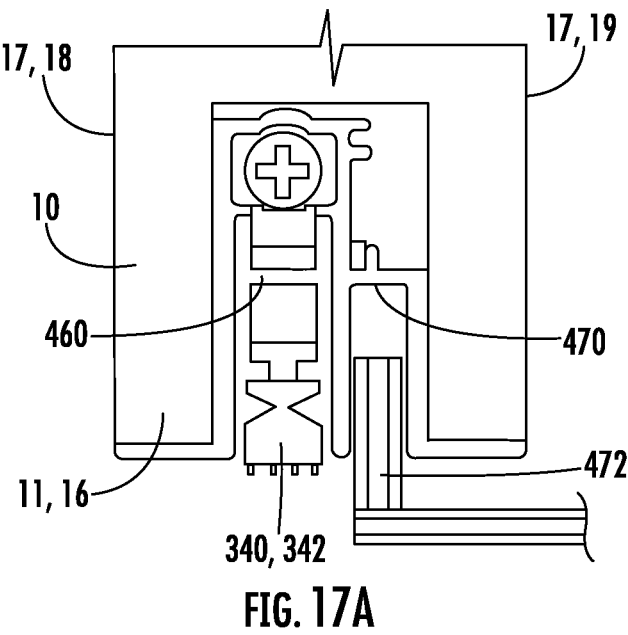

FIG. 17A illustrates a cross-sectional view of a floor seal system and door, in accordance with some embodiments of the present disclosure.

Figure 17B:
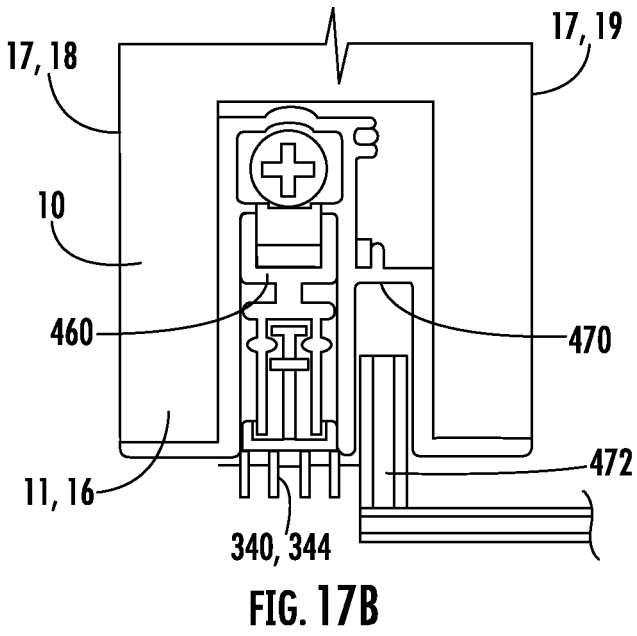

FIG. 17B illustrates a cross-sectional view of a floor seal system and door, in accordance with some embodiments of the present disclosure.

Figure 18:
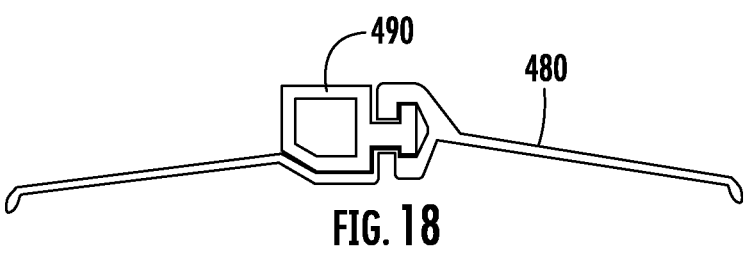

FIG. 18 illustrates a cross-sectional view of a threshold seal system and door, in accordance with some embodiments of the present disclosure.

FIG. 19A illustrates a type of seal, in accordance with some embodiments of the present disclosure.

FIG. 19B illustrates a type of seal, in accordance with some embodiments of the present disclosure.

FIG. 19C illustrates a type of seal, in accordance with some embodiments of the present disclosure.

FIG. 19D illustrates a type of seal, in accordance with some embodiments of the present disclosure.

FIG. 19E illustrates a seal holder, in accordance with some embodiments of the present disclosure.

FIG. 20 illustrates a process for installing the adjustable door frame for a sliding door, in accordance with some embodiments of the disclosure.

DETAILED DESCRIPTION

The following detailed description teaches specific example embodiments of the invention; however, other embodiments of the invention do not depart from the scope of the present invention. The terminology used herein is for the purpose of describing particular embodiments only and is not intended to be limiting of the invention. Like reference numbers reference to like elements.

The present disclosure relates to apparatuses, systems, and/or methods for a sliding door system 1 with security features, such as an electromagnetic compatibility (EMC) rated sliding door system (e.g., provides electromagnetic interference (EMI) or radio frequency interference (RFI) shielding), blast resistant sliding door system, forced entry ballistic resistant (FEBR) rated sliding door system, sound rated sliding door system, privacy door system, fire and/or smoke rated sliding door system, light and/or air flow reduction sliding door system, and/or the like. It should be understood the sliding door system 1 may be used with either a static frame 21 (e.g., traditional frames that require different sizes to be coupled with different wall thicknesses) or an adjustable frame 20 (e.g., having at least a first frame segment 30 that is adjustable with respect to a second frame segment 40) for door opening surfaces 8 (e.g., a wall 2 adjacent the door opening, the door opening edges 9, or the like). A sliding door system 1 may comprise one or more sliding doors 10 and sliding door hardware 4 (e.g., a track system, including tracks, wheels, supports, stops, seals, and/or the like, a soft close apparatus, including one or more actuators, springs, or the like—not illustrated, and/or other like door hardware) operatively coupled to the door 10, wall 2, door frame 20, or one or more door opening edges 9 that surround and/or are located within the opening of door). It should be understood that the sliding door 10 may be any type of sliding door 10, such as but not limited to a single sliding door, bypass doors, pocket sliding doors, patio sliding doors, barn sliding doors, bi-part sliding doors, or any other type of sliding door. As such, it should be understood that when discussing "a sliding door" herein, this may refer to any type of sliding door, and/or one or more sliding doors (e.g., such as bi-part sliding doors, or the like). Regardless of the type of door 10, the door 10 may have edges 11, such as opposing edges 12, 13 a top edge 15, a bottom edge 16, and opposing faces 17, such as a first face 18 (e.g., a front face) and a second face 19 (e.g., a back face).

In some embodiments the sliding door systems 1, and thus the one or more sliding doors 10 that may be panel doors (e.g., solid or hollow, or the like) and/or glazed doors (e.g., having one or more opaque, translucent, and/or transparent portions made from glass or other like material), may provide the security features discussed in further detail herein. As such, it should be understood that the sliding door systems 1, and thus the doors (e.g., regardless of being a panel door or glazed door) and/or the door frames 20, 21, may have security features, and as such may be EMC rated, fire rated, weather rated (e.g., windstorm, hurricane, tornado, or the like rated), blast rated, ballistic rated, attack resistant, be thermally efficient, or the like. Moreover, the sliding door systems 1 (e.g., particularly the glazed doors) may include a switchable panel (e.g., switchable glass) and/or interactive displays (T-OLED, OLED, LED, or the like displays that can display information). Furthermore, the sliding door systems 1 (e.g., the doors 10 and/or the door frames 20, 21) may include electrified hardware and/or accessories, such as sensors (e.g., cameras, radar, scanners, biometric, NFC, RFID, or the like) to allow for access control and/or control the information provided in the interactive displays. Furthermore, the sliding doors may have energy harvesting within the door and/or adjacent the door, such as energy harvesting panels. It should be understood that any combination of security features may be utilized. Moreover, as will be discussed in further detail herein the door frame 20, 21, a plurality of seals 300 between the door 10 and door frame 20, 21, walls 2, floor, ceiling, or the like may also be made of and/or be covered in materials that provide the security features discussed herein.

Embodiments of the invention will be described with respect to FIGS. 1A through 19E illustrating components of the sliding door system 1. As illustrated in FIG. 1A, the sliding door system 1 may comprise a plurality of seals 300, which will be discussed in further detail herein, that are used to interact with the door 10, the door frames 20, 21, the wall 20, a door retainer 90, a header 100, or the like to provide the security features discussed herein. As further illustrated in FIGS. 1A and 1B, the plurality of seals may comprise one or more first side seals 310, one or more second side seals 320, one or more top seals 330, and/or one or more bottom seals 340.

FIG. 1C illustrates a static door frame 21 having a single segment, while FIGS. 2 through 3C illustrate an adjustable door frame 20 having at least a first frame segment 20 that is adjustable with respect to a second frame segment 40. In alternate embodiments, the static door frame 21 may have two or more components, but the components may not be adjustable with each other. As illustrated in FIGS. 1A and 1B, the door frame (e.g., the static door frame 21 or the adjustable door frame 20) may comprise three (3) portions including an upper portion 24 disposed adjacent an upper end of a door opening, and two side portions 26, 28 disposed along either edge of the door opening. Each portion 24, 26, 28 may be made up of one or more elongated frame segments (e.g., a single non-adjustable static segment, a pair of elongated adjustable frame segments 30, 40, or the like) of sufficient length to fit the door opening. The door frame 20, 21 is assembled around the open edges 9 of wall 2. The door frame portions 24, 26, 28 may be secured to each other and/or an adjoining structure by frame connectors 22 (e.g., clips, tabs, fasteners, or the like). As further illustrated in FIG. 1A, a door 10 may be hung otherwise conventionally on the wall through sliding door hardware 4, which will be described in further detail herein. The door 10 may be any type of conventional door, any customized door, or the like.

As illustrated in FIG. 1C, the static frame 21 may comprise a first molding flange 32 that may form a door opening molding (e.g., outer or inner door opening molding), which may be parallel to a wall 2 (e.g., inner or outer wall). Moreover, the static frame 21 may have a jamb flange 34, 44 having a first end extending adjacent to an end of the first molding flange 32 (e.g., perpendicular to the first molding flange 32, or the like). In some embodiments, the jamb flange 34, 44 may have a planer surface. Furthermore, a second molding flange 42 may extend from a second end of the jamb flange 34, 44 and may be parallel to a wall 2 (e.g., inner or outer wall). In some embodiments, the first molding flange 32, the jamb flange 34, 44 and the second molding flange 42 may for a U-shaped frame segment.

As illustrated in FIGS. 2 through 3C, the adjustable frame 20 may have a first frame segment 30 and a second frame segment 40. A first frame segment 30 may be disposed on the outer side of the door opening (e.g., the side of wall that is normally outside of the door), and a second frame segment 40 may be disposed on the inner side of the door opening (e.g., the side of the wall that is normally enclosed by the door). However, in some embodiments the first frame segment 30 may be disposed on the inner side of the door opening and the second frame segment 40 may be disposed on the outer side of the door opening. In other embodiments, additional door frame segments may be utilized.

As illustrated in FIGS. 2 through 8, each portion of the adjustable door frame 20 may comprise as first frame segment 30 having a first molding flange 32 that may form a door opening molding (e.g., outer or inner door opening molding), which may be parallel to a wall 2 (e.g., inner or outer wall). Moreover, a first jamb flange 34 extends adjacent to an end of the first molding flange 32 (e.g., perpendicular to the first molding flange 32, or the like). In some embodiments, the first molding flange 32 and the first jamb flange 34 may be an L-shaped member. In some embodiments, the first jamb flange 34 may have a planer surface. The second frame segment 40 may have a second molding flange 42, which may be parallel to a wall 2 (e.g., inner or outer wall). Moreover, a second jamb flange 44 may extend adjacent to an end of the second molding flange 42 (e.g., perpendicular to the second molding flange 42, or the like). In some embodiments, the second molding flange 42 and the second jamb flange 44 may be an L-shaped member. In some embodiments, the second jamb flange 44 may have a planer surface.

The first frame segment 30 and the second frame segment 40 may be positioned around the internal edges 9 of the door opening. As illustrated in FIGS. 3A through 3C, the first frame segment 30 and the second frame segment 40 may be adjustable to account for different wall sizes, which may vary based on the width of the support members (e.g., studs, masonry, or the like), wall material thicknesses (e.g., drywall, plaster, sheet metal, or the like), or other like factors. As such, the adjustable door frame 20 may be installed on any wall having different thicknesses, that is, specific door frames do not have to be ordered for each door opening. In some embodiments, the adjustable door frame 20 may provide for an adjustment range of 0.5, 1, 1.5, 2, 2.5, 3, 3.5, 4, 4.5, 5, 5.5., 6.5, 7, or the like inches of adjustment between the first frame segment 30 and the second frame segment 40. Also, it should be understood that only one set of segments 30, 40 are needed to provide adjustment; however, in some embodiments the first frame segment 30 and/or second frame segment 30 may be swapped out with different segments (e.g., of different sizes, such as different lengths of the jamb flanges 34, 44) to provide larger or smaller ranges of adjustments.

As illustrated in FIG. 3A, the adjustable door frame 20 may be utilized on walls formed from steel studs and drywall. Alternatively, FIG. 3B illustrates that the adjustable door frame 20 may be used on masonry walls. Furthermore, as illustrated in FIG. 3C, the adjustable door frame 20 may be used on walls that have wood studs and drywall. It should be understood that the static door frame 21 (e.g., having different sizes) may also be used on a wall 2 and/or door opening edges 9 formed from any type of material (e.g., steel studs, drywall, wood, masonry wall, plaster, and/or the like). With respect to the adjustable door frame 20, regardless of the type of wall, the first segment 30 may at least partially overlap at least a portion of the second segment 40. For example, at least a portion of the first jamb flange 34 may overlap at least a portion of the second jamb flange 44, as illustrated in FIGS. 3A-3C. However, in alternate embodiments, at least a portion of the second jamb flange 44 may overlap at least a portion of the first jamb flange 34. In still alternate embodiments, the first jamb flange 32 and/or the second jamb flange 34 may be trimmed in order to change the range of adjustment and/or to allow the ends of the first jamb flange 34 and/or second jamb flange 44 to butt into each other (not illustrated) instead of overlapping.

The adjustable door frame 20 (as well as the static door frame 21) may be operatively coupled to the wall (e.g., the support member thereof, or the like) through the use of one or more segment connectors 150 (e.g., clips, tabs, fasteners, welds, and/or the like), such as first segment connectors 152, 154 and/or second segment connectors 156, 158. As illustrated in FIGS. 3B and 3C, some first segment connectors 152 may extend through the first molding flange 32 and into the wall 2 (e.g., drywall, support member, masonry, or the like) and/or some first segment connectors 154 may extend through the first jamb flange 34 and into the door opening edge (e.g., the support member, or the like). As further illustrated in FIGS. 3B and 3C, some second segment connectors 156 may extend through the second molding flange 42 and into the wall 2 (e.g., drywall, support member, masonry, or the like) and/or some second segment connectors 158 may extend through the first jamb flange 44 and into the door opening edge (e.g., the support member, or the like). It should be understood that the first segment connectors 154 and the second segment connectors 158 may be the same segment connector 150 (e.g., extending through both the first jamb flange 34 and the second jamb flange 36, and/or into a support member in the wall).

As illustrated in FIG. 4, in some embodiments one or more caps may be utilized to cover at least a portion of the first segment 30 and/or the second segment 40. For example, the first segment 30 may comprise a first molding cap 60 having a molding cap face 64 (e.g., parallel with the wall 2) and two molding cap legs 62, 66 (e.g., perpendicular with the wall 2), such as a wall molding cap leg 62 (e.g., adjacent the wall) and a jamb molding cap leg 66. The jamb molding cap leg 66 may be flush with the outer surface of the first jamb flange 34. Additionally, the second segment 30 may comprise a second molding cap 60 having a molding cap face 74 (e.g., parallel with the wall 2) and two molding cap legs 72, 76 (e.g., perpendicular with the wall 2), such as a wall molding cap leg 72 (e.g., adjacent the wall) and a jamb molding cap leg 76. The jamb molding cap leg 76 may be flush with the outer surface of the first jamb flange 44. It should be understood that the first molding cap 60 and/or the second molding cap 70 may be used with the static frame 21 in the same or similar way, as illustrated in FIG. 1C.

The first molding cap 60 and the second molding cap 70 may have one or more cap projections (e.g., a proximal cap projection 82, a distal cap projection 84, or the like) that interact with one or more flange projections (e.g., a proximal flange projection 52 and a distal flange projection 54). The molding caps 60, 70 may be operatively coupled to first flange segment 30 and the second flange segment 40, respectively, through the one or more cap projections being operatively coupled to the one or more flange projections. For example, the proximal cap projections 82 may be operatively coupled to the proximal flange projections 52 and/or the distal cap projections 84 may be operatively coupled to the distal flange projections 54 (e.g., snap fit together—over or between each other, or the like). However, it should be understood that the first molding cap 60 and the second molding cap 70 may be operatively coupled to the first flange segment 30 and the second flange segment 40 in other ways. It should be understood that the first molding cap 60 and/or the second molding cap 70 may be operatively coupled with the static frame 21 in the same or similar way, as illustrated in FIG. 1C.

FIG. 5 illustrates that in some embodiments a portion of cap may extend over a jamb flange and/or butt against a jamb flange. For example, the jamb molding cap leg 76 may extend over the second jamb flange 44 of the second frame segment 40. In some embodiments, the inner surface of the jamb molding cap leg 76 may contact the outer surface of the second jamb flange 44. Furthermore, in some embodiments, the end of the jamb molding cap leg 76 may butt up to the end of the first jamb flange 34. As such, in some embodiments as illustrated in FIG. 5, the outer surface of the second jamb molding cap leg 76, the outer surface of the first jamb flange 34, and the outer surface of the first jamb molding cap leg 66 may be flush and in the same plane.

It should be understood that should the second jamb flange 44 of the second frame segment 40 overlap the first jamb flange 34 of the first frame segment 30, then the first molding cap 60 may have the configuration of the second molding cap 70 described above. That is, the first jamb molding cap leg 66 may extend over the first jamb flange 34 of the first frame segment 40. In some embodiments, the inner surface of the first jamb molding cap leg 66 may contact the outer surface of the first jamb flange 34. Furthermore, in some embodiments, the end of the first jamb molding cap leg 66 may butt up to the end of the second jamb flange 44. As such, in some embodiments the outer surface of the first jamb molding cap leg 66, the outer surface of the second jamb flange 44, and the outer surface of the second jamb molding cap leg 76 may be flush and in the same plane.

As will be described in further detail herein, the jamb molding cap legs 66, 76 may be trimmed on site as needed depending on the thickness of the wall. For example, the thickness of the wall will set the location of the end of the first jamb flange 34 and the second jamb flange 44. Consequently, one or more of the jamb molding cap legs 66, 76 may be trimmed to butt up to the end of the first jamb flange 34 or the second jamb flange 44, respectively.

FIG. 6 further illustrates in some embodiments at least a portion of a cap (e.g., illustrated as the first segment cap 60 may extend over one or more jamb flanges 34, 44, cover one or more segment connectors 150, be operatively couple to a portion of the jamb flanges (e.g., illustrated as a projection on the second jamb flange 44) and/or an opposing cap (e.g., illustrated as the second segment cap 70). For example, as illustrated in FIG. 6, a first jamb molding cap leg 66 may be offset from (e.g., spaced apart from, or the like) and/or extend over the first jamb flange 34. As further illustrated in FIG. 6, the first jamb molding cap leg 66 may extend over at least a portion of the second jamb flange 44. In the illustrated embodiment, the first jamb molding cap leg 66 may have a leg projection 67 that is operatively coupled with a flange projection 45 of the second jamb flange 44. However, in order to allow for the adjustability of the first frame segment 30 and the second frame segment 40, there may be one or more leg projections 67 and one more flange projections 45 that can be trimmed and used depending on the adjustment made between the first frame segment 30 and the second frame segment. Alternatively, one or more leg projections 67 and one or more flange projections 45 may not interact with each other, but act only as a stand-off and/or support for the first jamb molding cap leg 66. In other embodiments the end of the first jamb molding cap leg 66 may be operatively coupled a portion of the second molding cap 70 (e.g., the molding cap face 74, the second jamb molding cap leg 76, or the like). With respect to the static frame 21, a portion first cap 60 or the second cap 70 may not need to extend over a portion of the jamb flange 34 since one or more segment connectors 150 may not be used through the jamb flange 34, 44 of the static frame 21. However, in some embodiments a portion of the first cap 60 or second cap 70 may extend over a portion of the jamb flange 34, 44 in the same or similar was as described with respect to the adjustable door frame 20.

FIG. 7 illustrates that in some embodiments, a retainer 90 may be utilized with the adjustable door frame 20. The retainer 90 may have multiple walls such as a jamb retainer leg 91, a wall retainer leg 92, a retainer face 94, a retainer stop 96, and a retainer mount 98. In some embodiments, the wall retainer leg 92 may also act as the retainer stop 96; however, in the illustrated embodiment, the wall retainer leg 92 and the retainer stop 96 are different walls (e.g., parallel with each other, or the like). The wall retainer leg 92 or the retainer stop 96, the retainer face 94 and the retainer mount 98 form a retainer cavity 99 which receives a first side edge 12 of the door 10 when the door 10 is in the closed position. The jamb retainer leg 91 may sit flush with the outer face of the first jamb flange 34. However, in other embodiments the jamb retainer leg 91 may extend over the jamb flange 34 and/or the second jamb flange 44 and/or butt against a jamb flange (e.g., second jamb flange 44), as previously described with respect to FIGS. 5 and/or 6. It should be understood that the retainer 90 is illustrated as being used with the first frame segment 30, however, in some embodiments the retainer 90 may be used with the second frame segment 40. It should be understood that the retainer 90 may also be used with the static frame 21, and as such, may be operatively coupled with the static frame 21 in the same or similar way.

FIG. 8 illustrates a header 100 comprising a header mount 102, a header body 104 (e.g., including hardware 4 for the sliding door, such as tracks, rollers, wheels, dampers, closers, stops, or the like or the like), and a header cap 106. The header 100 may be operatively coupled to the wall 2 over the door frame 20 (e.g., a second frame segment 40 and a second molding cap 70, as illustrated in FIG. 7, or the first frame segment 30 and a first molding cap 60). Alternatively, the header 100 may be operatively coupled to the door frame (e.g., as previously described with respect to the caps). The header 100 may be used to receive the top edge 15 of the door and/or to conceal the door hardware 4 (e.g., tracks, rollers, used for the sliding door system 1. As illustrated in FIG. 9, the header caps 106 for the header 100 may have different configurations (e.g., flat, rounded, angled, or the like). It should be understood that the header 100 may also be used with the static frame 21, and as such, may be operatively coupled with the static frame 21 in the same or similar way.

FIGS. 10 through 12B illustrate other embodiments of the inventions in which at least a portion of the first jamb flange 34 may have one or more proximal jamb portions 36 and one or more distal jamb portions 38 that form one or more first jamb channels 39. FIG. 10 illustrates that each door frame portion may have three first jamb channels 39; however, it should be understood that the majority of, or the entire length of, the door frame portion (e.g., the upper portion 24 disposed adjacent an upper end of a door opening, and two side portions 26, 28 disposed along either edge of the door opening) may have a jamb channel 39. As illustrated in FIGS. 11A and 11B, the one or more first jamb channels 39 may be configured to receive at least a portion of the second jamb flange 44 in order to aid in the first segment 30 and the second segment 40 being adjustable (e.g., slide, or the like) with respect to each other. Alternatively, or additionally, it should be understood that the second jamb flange 44 may have the one or more proximal jamb portions and one or more distal jamb portions that form one or more second jamb channels, which may receive a portion of the first jamb flange 34. As previously discussed herein the one or more segment connectors 150 may be used to operatively couple the first frame segment 30 and the second frame segment 40; however, it should be understood that the jamb channel 39 may not require segment connectors 150 (as illustrated in FIG. 11A), and one or more segment connectors 150 may only be used through the first molding flange 32 and the second molding flange 42.

FIGS. 12A and 12B illustrates, as previously described with respect to FIGS. 4 through 6, one or more caps (e.g., a first segment cap 60, a second segment cap 70, or the like) may be used with the door frame 20 having the one or more jamb channels 39. As illustrated in FIGS. 12A and 12B, the one or more caps 60, 70 may have jamb molding cap legs 66, 76, one of which extends over at least one jamb flange (e.g., illustrated as the second jamb flange 42) and butts into the opposite jamb flange (e.g., illustrated as the end of the distal portion 38 of the first jamb flange 32). The one or more caps may be operatively coupled to the first frame segment 30 and the second frame segment 40, as previously described herein (e.g., using one or more projections, or the like). FIG. 12A further illustrates that in some embodiments, the one or more caps may have walls that form a seal channel 172 (e.g., kerf seal channel, or the like) that receives a seal 170 (e.g., kerf seal, or the like), for providing security features, which will be described in further detail below. It should be understood that caps 60, 70 having a seal channel 172 for a seal 170 may also be used with the static frame 21 in the same or similar way.

As generally discussed above, the jamb molding cap legs 66, 76 may be long enough to allow for the adjustability of the first frame segment 30 and the second frame segment to be adjusted with respect to each other. After the first frame segment 30 and the second frame segment 40 spacing is determined to fit around the internal edge surfaces 9 of the door opening, the one or more caps 60, 70 may be trimmed such that the jamb molding cap leg butts into and adjacent jamb flange. As illustrated in FIGS. 12A and 12B, the second segment cap 70 may be trimmed along the second jamb molding cap leg 76 at a trim location 78 and the excess leg portion 79 may be discarded or used for a different purpose. As such, as illustrated the second jamb molding cap leg 76 may butt (e.g., located adjacent to, touch, or the like) up to the end of the first jamb flange 34, such as the distal jamb flange portion 38. While the second segment cap 70 is illustrated as having the jamb molding cap leg 76 that can be trimmed and/or having the seal channel 172 for the seal 170, it should be understood that the first segment cap 60 may have these features.

FIGS. 13A and 13B illustrate alternate ways in which the first frame segment 30 may be operatively coupled to the second frame segment 40. For example, the first frame segment 30 and/or the second frame segment may have an adjustment system 440. In some embodiments, the adjustment system 440 may comprise one or more adjustment members 441. For example, as illustrated in FIG. 13A, the one or more adjustment members 441 (e.g., an adjustment tab, or the like) may be operatively coupled to the second frame segment 40, such as a first adjustment member 446, second adjustment member 448, additional adjustment members, or the like. The one or more adjustment members 44 may be utilized for operative coupling with the first frame segment 30. It should be understood that while the one or more adjustment members 441 may be illustrated as extending from the second frame segment 40, the one or more adjustment members 441 may additionally, or alternatively, extend from the first frame segment 30. The one or more adjustment members 441 may be tabs that extend from one or more jamb flanges 34, 44 (e.g., first jamb flange 34 or second jamb flange 44). Alternatively, or additionally, the one or more adjustment members 441 may be formed separately from, and later operatively coupled to, one or more of the jamb flanges 34, 44.

As illustrated in FIG. 13A, the one or more adjustment members 441 may comprise adjustment tabs 446, 448 having a tab apertures 449 therethrough (e.g., a slotted aperture, or the like). As previously discussed herein, one or more segment connectors 150 may be used in order to facilitate assembly of the one or more adjustment members 444. For example, fasteners, such as anchor screws or locking screws, may be pre-assembled to the first frame segment 30 and/or the second frame segment 40. In some embodiments, pre-formed apertures may be formed in the first frame segment 30 and/or the second frame segment 40. As such, the first frame segment 30 and/or the second frame segment 40 may be shipped disassembled and/or at least partially pre-assembled. For example, as illustrated in FIG. 13A, a fasteners may be assembled through pre-drilled apertures in the first frame segment 30 and through the tab apertures 449 of the adjustment tabs 446, 448 in order to allow the fasteners to slide within the adjustment tabs. When the width of the adjustable frame is set, another fastener may be used to prevent further movement between the first frame segment 30 and the second frame segment.

As illustrated in FIG. 13B, in some embodiments, the adjustment system 440 may comprise the one or more adjustments members 441 previously discussed herein. As such, the one or more adjustment members 441 may comprise a first adjustment member 442 that may be operatively coupled to a second adjustment member 444. The first adjustment member 442 may comprise an adjustment tab 446 having a tab aperture 449 therethrough (e.g., a slotted aperture, or the like). The second adjustment member 444 may comprise an adjustment receptacle 450 (e.g., bracket, or the like) that may receive the adjustment tab 446. The adjustment receptacle 450 may have one or more receptacle flanges 462 that are operatively coupled to the first segment 30 (e.g., welded to the inside surface of the first jamb flange 32, or the like) and one or more receptacle hoods 464 that are offset from the one or more receptacle flanges. The flanges 462 and hood 464 form a receptacle cavity 466 that is configured to receive the adjustment tab 446, such as slidably receive the adjustment tab 446 to allow for a width adjustment of the door frame 20 (e.g., changing the position of the first segment 30 with respect to the second segment 40). The adjustment system 440 may further aid in restricting rotational movement of the first segment 30 with respect to the second segment 40 (e.g., due to the receipt of the adjustment tab 446 within the adjustment receptacle 450). It should be understood that the adjustment receptacle 450 may be factory installed and/or installed in the field (e.g., molding, forming, bonding, welding, or the like).

In order to facilitate the assembly of the one or more adjustment members 441 (e.g., assembly of the first adjustment member 442 to the second adjustment member 444), as illustrated in FIG. 13B, the first segment 30 may have one or more access apertures that allow a user to use one or more of the segment connectors 70 (e.g., a width adjustment connector 72) to operatively couple the first segment 30 to the second segment 40. As illustrated in the figures, one or more segment connectors 70 may be used to operatively couple the first segment 30 to the second segment 40 for preventing further adjustment of the width of the door frame 20. For example, one or more segment connectors 70 may be utilized (e.g., inserted through, accessed if the connectors 70 are self-contained, or the like) through one or more access apertures in the first segment 30 to operatively couple the first adjustment member 442 (e.g., the adjustment tab 446) to the second adjustment member 444 (e.g., the receptacle hood 464 of the adjustment receptacle 450). As illustrated in FIG. 13B, since the first segment 30 can be operatively coupled to the second segment 40 from the outside of the door frame 20, then the door frame 20 may be assembled to a wall of the door opening without having to first set the width of the adjustable door frame 20.

As generally discussed above, it should be understood that security features may be incorporated into the sliding door system 1, as will be discussed in further detail herein with respect to FIGS. 1A, 1B, and 14A through 19E. As illustrated in FIGS. 1A and 1B, the sliding door system 1 may have a plurality of seals 300, that aid in providing securing features. Additionally, the door 10 (e.g., the core, faces 17, and/or edges 11), the door frame 20, 21, and/or the walls, 2, floor, and ceiling of the adjacent rooms may include the security features. For example, the sliding door system 1 may provide electromagnetic shielding, sound resistance, forced entry and/or ballistic resistance, privacy features, light reduction, fire and/or smoke resistance, or the like.

In particular, the sliding door system 1 may be an electromagnetic compatibility (EMC) rated sliding door system (e.g., provides electromagnetic interference (EMI), radio frequency interference (RFI), microwave, or the like shielding). The EMC shielding 350 is used to restrict (e.g., reduce, eliminate, or the like) the passing of radio waves, electromagnetic fields, and electrostatic fields outside of the room. Typical shielding materials used for EMC shielding 350 may include an EMC coating 352, such as a fluid (e.g., liquid, mist, gas, or the like) having a suitable EMC shielding material, typically copper, silver, nickel, or the like, or combinations thereof, in the form of particles suspended in the fluid. The EMC coating 353 is applied to a surface, and thereafter dries, to form the EMC shielding 350. Alternatively, the EMC shielding 350 may be an EMC shielding barrier 354 (e.g., fabric-wrapped foam, wire mesh, stamped metal, elastomer, adhesive, glue, resin, epoxy, tape, caulk, or the like) that may be applied to a surface or between surfaces. For example, the EMC shielding barrier 354 may be a copper layer, copper screen, or the like in order to absorb the radio and magnetic waves.

EMC shielding 350 may be used in many different applications, such as in healthcare rooms (e.g., MRI rooms, or the like), IT/data storage facility protection, government buildings (e.g., embassies, department of state, secret service, or the like), military applications, businesses, labs, emergency call centers, sensitive electronic installations, security facilities, financial centers, RFID scanning locations, or the like. As such, EMI shielding may be used to help avoid computer crashes, protect sensitive electronic equipment, protect storage of confidential information, avoid interference from RF transmitters (e.g., from radio towers, TV broadcast, airport radar, test equipment, or the like), and/or other like applications.

Frequencies at which electromagnetic radiation of energy occurs is at follows: at very low frequencies: —30 kHz, low: 30 to 300 kHz; medium frequencies: 300 to 3,000 kHz; high frequencies: 3 to 30 MHz, very high frequencies: 30 to 300 MHz, ultrahigh frequencies: 300 to 3,000 MHz, superhigh frequencies: 3 to 30 GHz, and extremely high frequencies: 30 to 300 GHz. Typical EMC shielding shields from approximately 70 dB to 140 dB from 10 kHz to 10 GHz; however, it should be understood that EMC shielding may occur within these ranges, overlap these ranges, or fall outside of these ranges. EMC (EMI-RFI) shielding protection of the adjustable sliding door system can support IEEE 299 levels (as of the date of filing), or the like. The relative capability of a shield to screen out undesirable electric and magnetic fields and plane waves is the ratio of the signal received without the shield to the signal received inside the shield.

A room that is designed for EMC shielding typically has shielding in the walls 2, doors 10, ceiling, floor, frame 20, 21, or the like. Moreover, the EMC shielding 350 may be utilized, such as by forming a component from EMC material, covering a component in one or more layers (e.g., sheets, or the like) of an EMC material, coating a component with a fluid (e.g., liquid, mist, gas, or the like) that has EMC material particles suspended therein, or the like. It should be understood, breaks in the shielding reduce the effectiveness of the EMC shielding 350. As such, in order to use provide the EMC shielding 350 in the present embodiments the components of the sliding door system 1 incorporate the EMC shielding 350 in one or more ways.

With respect to door frames, the static door frame 21 and/or the adjustable door frame 20 may have EMC shielding 350, such as a painted EMC shielding coating 352 (e.g., cooper, silver, nickel, or the like, particles, or combinations thereof in a fluid). For example, the segments previously discussed herein, such as the single segment of the static door frame 21, first frame segment 30, the second frame segment 40, or the like, may be covered with a painted EMC shieling coating 352. It should be understood that EMC shielding material may be included on one side or both sides of the segments. Alternatively, or additionally, in order to maintain the effectiveness of the EMI shielding, a EMC shielding barrier 354 (e.g., fabric-wrapped foam, wire mesh, stamped metal, elastomer, adhesive, glue, resin, epoxy, tape, caulk, or the like) may be applied on the segments or between the segments (e.g., single segment, the first segment 30, the second segment 40, or the like) and/or between the frame 20, 21 and the wall 2, or the like. For example, the EMC shielding barrier 352, such as a caulk, may be used on the edges of the frame 20, 21 (e.g., to the wall 2, between segments 30, 40, or the like) to maintain the EMC circuit between the frame 20, 21 and the wall 2. Consequently, not only may the door frame be an adjustable door frame 20, but it can still be used to provide EMC shielding.

It should be understood, that like door frame 20, 21 the caps described herein (e.g., the first cap 60, the second cap 70, or the like) may also have EMC shielding 350, such as a painted EMC shielding coating 352 (e.g., cooper, silver, nickel, or the like, particles, or combinations thereof in a fluid). It should be understood that EMC shielding material may be included on one side or both sides of the caps 60, 70. Alternatively, or additionally, in order to maintain the effectiveness of the EMI shielding, a EMC shielding barrier 354 (e.g., fabric-wrapped foam, wire mesh, stamped metal, elastomer, adhesive, glue, resin, epoxy, tape, caulk, or the like) may be applied on the caps 60, 70 or between the caps 60, 70 and the door frame 20, 21 (e.g., single segment, the first segment 30, the second segment 40, or the like) and/or between the edges of the caps 60, 70 and the wall 2, or the like. For example, the EMC shielding barrier 352, such as a caulk, may be used on the edges of the frame 20, 21 (e.g., to the wall 2, between segments 30, 40, or the like) to maintain the EMC circuit between the frame 20, 21 and the wall 2, or the like. Consequently, not only may the door frame be and adjustable door frame 20, but it can still be used to provide EMC shielding.

As illustrated in FIG. 14A in order to maintain the EMC shielding 350 between the frame 20, 21 and/or caps 60, 70 with the door 10 in the sliding door system 1, the door 10 may have shielding on the faces 17 (e.g., front face 18, rear face 19) and/or formed as one or more layers within the door 10, as well as on the edges 11 of the door 10 (e.g., the first side edge 12, the second side edge 13, the upper edge 15 and the bottom edge 16). As illustrated in FIG. 14A, the EMC shielding 350 may be the painted EMC shielding coating 352, however, it could be the EMC shielding barrier 354 described above.

In addition to the door 10 and frame 20, 21 having EMC shielding 350, FIGS. 14B through 18 illustrate additional components of the sliding door system 1 that may have EMC shielding 350 in order to maintain the EMC shielding circuit without having any or having minimal areas with brakes in the EMC shielding 350. FIG. 14B illustrates and embodiment of the retainer 90 and first frame portion 26 previously described herein. In the illustrated embodiment the retainer 90 may be an EMC retainer 390 having the walls previously described herein with respect to FIG. 7. Like the frames 20, 21, discussed above the retainer (e.g., the walls, such as a jamb retainer leg 91, a wall retainer leg 92, a retainer face 94, a retainer stop 96, a retainer mount 98). As such, the EMC retainer 90 may have EMC material 350, such as an EMC shielding coating 352 and/or EMC shielding barrier 354 between the EMC retainer 390, the door 10, the door frame 20, 21 (e.g., with or without a cap 60, 70, or the like). As such, the first door edge 12 and the retainer stop 96 may contact each other when the door 10 is closed in order to reduce breaks in the EMC shielding. Moreover, as illustrated in FIG. 14B, the retainer 90 may include one or more first side seals 310, such as a single fin gasket 312, which may be formed from an EMC shielding material 350. As such, even if the door edge 12 and the retainer 390 (e.g., the retainer stop 96), a circuit may still be formed through the one or more first side seals 310. As such, EMC breaks may be minimized between the door 10, the EMC retainer 390, the EMC caps 60, 70, the EMC frames 20, 21, and/or the wall 2.

FIGS. 15A and 15B illustrate the second side edge 13 of the door 10 and the door frame 20, 21 of the second frame portion 28. Similar to the first frame portion 26 and retainer 390 discussed with respect to FIG. 14B, the second frame portion 28 and the second door edge 11, 13 illustrated in FIGS. 15A and 15B may have EMC shielding 350. As previously, discussed the frames 20, 21 (e.g., first frame segment 30, second frame segment 40, single segment, or the like) and/or the caps 60, 70 may have having EMC shielding coating 352, additionally or alternatively, an EMC shielding barrier 354 described above could be used. Furthermore, as illustrated the one or more second side seals 320 may be used, which may be made from an EMC material. For example, as illustrated in FIG. 15A, the second side seal 320 may be a trailing edge pile gasket 322 that is operatively coupled adjacent the second edge 13 of the door 10, such as on the second face 19 of the door. Additionally, or alternatively, as illustrated in FIG. 15B, the second side seal 320 may be a trailing edge gasket 324 that is operatively coupled adjacent the second edge 13 of the door 10, such as on the second face 19 of the door. In some embodiments, the second frame portion 28 (e.g., the adjustable frame 20, the static frame 21, and/or a cap thereof 60, 70) may be operatively coupled to a frame gasket 326. In still other embodiments, the second frame portion 28 (e.g., the cap thereof 60, 70) may have a seal channel 172 for being operatively coupled to a seal 172, such as a kerf seal that is made from EMC material, as previously illustrated in FIGS. 12A and 12B.

FIGS. 16A and 16B illustrate the top edge of the door and the door frame 20, 21 of the upper frame portion 24 and the header 100 previously described with respect to FIG. 8, such as a header mount 102, a header body 104 (including hardware 4 for the sliding door, such as tracks, rollers, wheels, dampers, closers, stops, or the like or the like), and a header cap 106. The EMC header 400 may be operatively coupled to the wall 2 over the door frame 20 (e.g., a second frame segment 40 and a second molding cap 70, as illustrated in FIGS. 16A and 16B, or the first frame segment 30 and a first molding cap 60). Alternatively, the EMC header 400 may be operatively coupled to the door frame 20, 21 (e.g., in the same or similar way as previously described with respect to the caps 60, 70). As such, the EMC header 400 may have EMC material 350, such as an EMC shielding coating 352 and/or EMC shielding barrier 354 between the EMC header 400 and/or the components thereof, and the door frame 20, 21 (e.g., with or without a cap 60, 70, or the like) and/or the wall 2. Moreover, as illustrated in FIGS. 16A and 16B, the EMC header 400 may include one or more upper edge seals 330, which may be formed from an EMC shielding material 350. As such, a circuit may still be formed through the one or more upper edge seals 330, the door 10, EMC header 400, and upper door frame portion 24 (with or without the caps 60, 70). As such, EMC breaks may be minimized or removed between the door 10, the EMC header 400, the EMC caps 60, 70, the EMC upper frame portion 24, and/or the wall 2. For example, as illustrated in FIG. 16A, the one or more upper seals 330 may be one or more single fin gaskets 332 that are operatively coupled to the header 100 (e.g., the header mount 102, the header body 104, and/or the head cap 106) adjacent the top edge 13 of the door 10, such as adjacent the first face 18 or the second face 19 of the door 10. Additionally, or alternatively, as illustrated in FIG. 16B, one or more seals may be a pile top edge gasket 334 that is operatively coupled to the EMC header 400 (e.g., the header mount 102, or the like) adjacent the upper edge 15 of the door 10, such as on the second face 19 of the door. In some embodiments, the one or more top seals 330 may be operatively coupled to the upper frame portion 24 (e.g., the adjustable frame 20, the static frame 21, and/or a cap thereof 60, 70) directly and not through the header 100 (e.g., the header mount 102). In still other embodiments, the upper frame portion 24 (e.g., the cap thereof 60, 70) may have a seal channel 172 for being operatively coupled to a seal 170, such as a kerf seal that is made from EMC material, as previously illustrated in FIGS. 12A and 12B.

FIGS. 17A and 17B illustrate a floor seal system 450 (e.g., automated bottom seal) at the bottom edge 16 of the door 10. Similar to the frame portions 24, 26, 28 discussed previously, the seal mount 460, the bottom seal 340, the alignment track 470, the alignment pin 472 may have EMC shielding 350. As previously discussed, the door 10 may have EMC shielding 350, such as an EMC shielding coating 352. Moreover, like the frame 20, 21 and/or the caps 60, 70, the seal mount 460, the alignment track 470, and/or the alignment pin 472 may also have EMC shielding 350, such as EMC shielding coatings 352 and/or an EMC shielding barriers 354. Furthermore, as illustrated in FIGS. 17A and 17B, the one or more bottom seals 340 may be made from an EMC material 350. For example, as illustrated in FIG. 17A, the one or more bottom seals 340 may be a surface gasket seal 342 that is operatively coupled to the seal mount 460. Alternatively, as illustrated in FIG. 17B, the one or more bottom seals 340 may be a fin gasket seal 344 that is operatively coupled to the seal mount 460.

FIG. 18 further illustrates that in some embodiments a threshold 480 may be utilized in order to reduce the gap between a bottom edge 16 of the door 10 in order to maintain the EMC circuit between the door 10 and the floor (e.g., EMC shielding 350 on or in the floor). As such, the threshold 480 may be made of or be operatively coupled to an EMC material 350, such as an EMC shielding coating 352 and/or an EMC shielding barrier 354. In some embodiments the plurality of seals 300 may further comprise a threshold seal 490 that is operatively coupled to the threshold 480 (e.g., a channel in the threshold 480, or the like) which may interact with the bottom edge 16 of the door and/or bottom seal 340. As such, when the sliding door 10 is closed, the one or more bottom seals 340 may be activated (e.g., moved downwardly) to contact the threshold 480 and/or the threshold seal 490 in order to maintain the EMC circuit between the door 10 and the floor.

FIG. 19 illustrates different types of seals for the plurality of seals 300 and/or a seal holder 302 that may be used to operatively coupled the plurality of seals 300 to the different components described herein. It should be understood the present invention may utilize any type of seal in any location; however, in some embodiments the plurality of seals may include a single fin gasket 312, 332 (see FIG. 19A), a multiple fin gasket 326 having fins of different lengths (see FIG. 19B), a multiple fin gasket 324 having fins of the same length (see FIG. 19C), a pile gasket 322, 334 (see FIG. 19D), or the like.

It should be understood that the embodiments of the present invention provides improved EMC shielding 350 for the sliding door system 1. However, it should be understood that alternatively, or additionally, the EMC shielding 350 security features of the sliding door system 1 may be replaced by, or may also provide, other security features. For example, the security features may include FEBR protection (e.g., forced entry, ballistic, blast, or the like protection), sound abatement, fire and/or smoke protection, air flow reduction, or the like, and/or combinations of any of the foregoing.

With respect to sound abatement, it should be understood that the plurality of seals 300 may be made of a material for sound abatement, such as silicone, or the like material, which provides sound and light from infiltrating a room. Moreover, the seals may be high-temperature seals that are effective between −58 to 450 degrees F., or more. As such, the sliding door 10, the plurality of seals 300, the frames 20, 21, caps 60, 70, retainer 90, header 100, or the like may meet ASTM E90 and BS EN ISO 140-3 for sound control.

With respect to fire and/or smoke protection, the plurality of seals 300 may be made of a material, such as silicone, or the like, which may be effective up to and over 450 degrees to provide smoke and/or fire abatement. Moreover, the sliding door 10, the plurality of seals 300, the frames 20, 21, caps 60, 70, retainer 90, header 100, or the like may include intumescent compounds (e.g., seals, or the like) as the plurality of seals 300 or may include intumescent compounds separate from and located adjacent to the plurality of seals 300, such that the door system 1 provides 30, 35, 40, 45, 50, 55, 60, or the like minutes of fire abatement. (e.g., meeting UL 10B fire tests and/or UL 10C positive pressure fire tests). Furthermore, the door system 1 may meet UL 1784 and/or NFPA 105-2013 for smoke abatement, and allow no more than 3.0 cfm per square foot at 0.10" water column (about 75 Pa).

Furthermore, the door system 1 may provide air flow abatement, and as such the sliding door system 1 may meet ASTM E-283-04 (2012) for low air leakage allowance, and/or allows no more than 0.3 cfm per square foot at 1.57 psf.

In some embodiments, in the event that the door 10 and/or door frame 20 are FEBR rated, the door 10 and/or door frames 20, 21 may include one or more layers of conventional and/or non-conventional ballistic resistant materials. In one embodiment the non-conventional ballistic resistant materials may include (i) a first layer (e.g., a projectile resistant layer) formed from one or more fiber layers, and (ii) one or more additional layers of a sheet (e.g., a porous sheet) and/or one or more additional layers of a fill material. Typically, the first layer may comprise a single fiber layer or a plurality of fiber layers. Each of the one or more fiber layers may comprise, at least in part, a woven or non-woven fibers (e.g., textile fabrics, plastics, or the like).

With respect to fiber layers that are fabric layers, the fabric layers may be manufactured by weaving, knitting or otherwise interlacing certain fibers. In some embodiments, the fabric layers comprise woven (or knitted or interlaced) mineral fibers, such as basalt fibers, in part or in its entirety. In other words, the fabric layer may be formed from a solid mineral, such as basalt. The fabric layer (e.g., the basalt fabric layer, or the like) may comprise a thickness in the range of about 0.005-0.1 inches. In some embodiments, the basalt fabric layer comprises a thickness of about 0.01, 0.015, 0.02, 0.025, 0.030 inches (+/−0.005) and a density of 0.03, 0.04, 0.05, 0.06, 0.07, 0.08, 0.09, 0.10 oz./sq. ft. (+/−0.005). However, it should be understood that the thickness of each of the one or more fabric layers may be any thickness, and/or have any density (e.g., range between, overlap, and/or fall outside of any of the forgoing values). While the fabric layers may be made, at least in part, from basalt, in other embodiments, at least a portion of the fabric layers may be made out of other minerals, metals, alloys, plastics, composites, organic materials, polymers, etc. It should be understood that the use of one or more fabric layers may aid is resisting physical impacts, as will be discussed in further detail herein.

With respect to plastic layers (e.g., non-woven UHMWPE, or the like), the plastic fibers may be formed into a sheet using a bonding material (e.g., resin, or other like bonding material). In some embodiments the plastic layers may comprise plastic fibers that are bonded with resin into a sheet. In other words, the plastic layer may be formed from a solid mineral (e.g., plastic fibers and resin), such as UHMWPE. The plastic layer (e.g., the UHMWPE layer, or the like) may comprise thicknesses that are the same as or similar to the thickness described with respect to the fabric layers discussed above. While the plastic layers may be made, at least in part, from UHMWPE, in other embodiments, at least a portion of the plastic layers may be made out of other types of plastics, or metals, alloys, composites, organic materials, polymers, or the like. It should be understood that the use of one or more plastic layers may aid is resisting physical impacts, as will be discussed in further detail herein. The plastic layer (e.g., UHMWPE, or the like) may be 10, 12, 15, 17, 20, or the like times stronger than steel and/or approximately twice as strong as other high strength polymers (e.g., Kevlar), but is also be light enough to float (e.g., approximately 20, 30, 40, 50 or the like lighter than Kevlar).

It is noted that the one or more fiber layers may form the first layer (e.g., a projectile resistant layer). In the instances where multiple fiber layers form the first layer, the fiber layers may all be the same or similar in terms of materials, fiber composition, fiber thickness, weave pattern, non-weave pattern, grain orientation, and other characteristics, or the fiber layers may differ with respect to at least one characteristic. For example, the fiber layers may be orientated in the same direction or may be orientated in different directions. That is, for example, successive fiber layers may be rotated any degree with respect to each other (e.g., in particular, when the fiber layers are woven and may have a pattern). As such, should the fiber layers have a particular pattern, the fiber layers may be orientated such that the fiber pattern does not line up between at least two of the fiber layers. It should be further understood that when a plurality of fiber layers are used for the first layer, the plurality of fiber layers may be operatively coupled to each other in one or more various ways. For example, the fiber layers may be mechanically coupled together, such as through the use of fasteners (e.g., rivets, pins, needles, or the like) that may be inserted through the fiber layers (e.g., in some cases through the weaves of fabric layers, or the like). Additionally, or alternatively, the fiber layers may be operatively coupled together through the use of a compound (e.g., adhesive, glue, resin, epoxy, tape, caulk, or the like) that is applied to one or more opposing surfaces of the fiber layers. In other embodiments, the fiber layers may be operatively coupled together by sandwiching the fiber layers between other layers that are operatively coupled together, by placing the fiber layers within a shell, and/or by bounding the fiber layers with a string, ribbon, mesh, fabric, or other flexible material that may be wrapped around at least a portion of the fiber layers in order to create the first layer (e.g., the projectile resistant layer). It should be understood that the layers described herein may be added to and/or lined with the frame 20, 21 portions 24, 26, 28 and/or the segments thereof 30, 40 before, during, and/or after manufacturing, packaging, installation, or the like using the same or similar couplings as described with respect to operatively coupling the layers to each other. As such, the layers, including the fill material, may be pre-assembled to one or more of the segments (e.g., single frame segment, a first frame segment 30, a second frame segment 40, or the like), or assembled to the one or more of the segments and/or after the door frame 20 is installed in the door opening.

It should be understood that the door 10 and/or the door frame 20, 21 may further comprise additional layers, each of which may comprise one or more fiber layers. For example, the door 10 and/or door frame 20, 21 may have a second layer, third layer, fourth layer, or the like, each of which are formed from one or more fiber layers. In the instances where the door 10 and/or door frame 20, 21 comprise multiple projectile resistant layers of one or more fiber layers, each of the projectile resistant layers may be the same or different with respect to the number of the fiber layers therein, arrangement/ordering of the fiber layers therein, characteristics of the fiber layers therein, and/or the like.

Referring to the additional layers of the door 10 and/or door frame 20, 21 the one or more additional layers may comprise a sheet (e.g., a porous sheet), which may typically comprise a material having a plurality of apertures in the form of voids, cavities, hollow interior chambers, surface hollows, slots, and/or through holes. These plurality of apertures may extend over a portion of a thickness, length, and/or width of the sheet, and/or they may extend over the entirety of the thickness, length, and/or width of the sheet. Additionally, the plurality of apertures may extend only partially into the sheet (e.g., embossed into the sheet), or the plurality of apertures may be through-holes. Moreover, in some embodiments, the sheet may be a porous sheet, such as, a foam sheet. The foam sheet may be made from a metal, such as aluminum or its alloys. The aluminum foam sheet is porous with a plurality of apertures that create a sponge-like structure and is ultra-light weight, resulting in aluminum foam sheet being able to float in water. The aluminum foam sheet is non-flammable and does not emit any toxic gases. Moreover, the porosity of the aluminum foam sheet (e.g., the air-filled voids in particular), provide acoustic absorption and electromagnetic shielding. The aluminum foam sheet may be manufactured from recycled materials.

The foam sheet may comprise a thickness in the range of about 0.05 to 1.875 inches (or in some embodiments up to 3 inches or more for thicker doors and/or door frames 20). In some embodiments, the foam sheet comprises a thickness of about 0.1, 0.15, 0.20, 0.25, 0.3, 0.35, 0.40, 0.45 to 0.70, 0.75, 0.80, 0.85, 0.9, 0.95, 1, 1.1, 1.2, 1.3, 1.4, 1.5, 1.6, 1.7, 1.8, 1.875, or more inches and a density of about 0.63 lbs./sq. ft (0.55, 0.57, 0.59, 0.61, 0.65, 0.67, 0.69, 0.71, or the like). However, it should be understood that the foam sheet may have any thickness and/or any density (e.g., having a range that falls between, overlaps, and/or falls outside of any of the forgoing values). While the foam sheet may be made of aluminum, in some embodiments, the foam sheet is made from other metals, steel, alloys, minerals, plastics, composites, organic materials, polymers, or the like. In some embodiments, the sheet is a grating framework made from suitable metals (e.g., aluminum), steel, alloys, minerals, plastics, composites, organic materials, polymers, or the like.

With respect to the one or more additional layers of a fill material, the fill material may comprise an undifferentiated whole structure, a collection of discrete structures, and/or combinations thereof. In the embodiments where the fill material comprises an undifferentiated whole structure, the fill material may be in the form of a solid or foamed sheet. In this regard, the fill material may be a polystyrene sheet having a thickness in the range of about 0.1, 0.15, 0.20, 0.25, 0.3, 0.35, 0.40, 0.45 to 0.70, 0.75, 0.80, 0.85, 0.9, 0.95, 1, 1.1, 1.2, 1.3, 1.4, 1.5, 1.6, 1.7, 1.8, 1.875, or more. However, it should be understood that the fill material may have any thickness (e.g., range between, overlap, and/or fall outside of any of the forgoing values). In the embodiments where the fill material comprises a collection of discrete structures, the fill material may be in the form of pellets, spheroids, grains, or the like. It should be understood that the fill material may be a solid material, or it may be a liquid material that later becomes solid. In some embodiments, the fill material may provide insulation for the door 10 and/or door frame 20, 21.

In some embodiments, the fill material may be a homogenous cementitious material (e.g., concrete, or the like), a composite cementitious material (e.g., including a mixture of cementitious material and/or other materials, such as fibers, foam, or the like). It should be understood that cementitious means any type of cement or other like material, such as traditional cement, fly ash, blast-furnace slag, limestone fines, aggregate, and/or other types of cementitious materials, alone or in combination with each other. The fill material, such as the composite cementitious material, may be much lighter than traditional homogenous cementitious material. For example, the fill material may be 10, 20, 30, 40, 50, 60, 70, or the like percent lighter than traditional cementitious material, or range between, overlap, and/or fall outside of any of these values. It should be understood that the cementitious material may be inserted into (e.g., poured, or the like) into the cavity in the form of a liquid fill material (e.g., completely liquid, liquid having particulates, and/or the like) which then hardens into a solid core.

The arrangement of the layers in the door 10 and/or door frame 20, 21 will now be described in accordance with some embodiments of the invention. In some embodiments, one or more additional layers of a sheet and/or one or more additional layers of a fill material may be positioned in between a first layer, a second layer, and a third layer, each of which has one or more fiber layers. In other embodiments, a pair of layers (e.g., a first layer and a second layer) may be positioned adjacent each other. In yet other embodiments, a sheet (e.g., porous sheet) and a layer of a fill material may be placed next to each other. That said, the one or more layers, each comprising one or more fiber layers, and the one or more additional layers comprising one or more sheets and/or one or more filler layers may be arranged in any suitable order and in any suitable combination, based on the desired application. In some embodiments, the one or more additional layers of a sheet may be operatively coupled to the one or more fiber layers. In some embodiments, the one or more one or more filler layers may be operatively coupled to the one or more fiber layers. It should be understood that the one or more fiber layers, the one or more porous sheets, and/or the one or more filler layers may be operatively coupled to each other as was previously described with respect to operatively coupling the multiple fiber layers together (e.g., fasteners, adhesive, bounding, or the like).

The door 10 and/or door frames 20, 21 of the present disclosure may provide outstanding resistance to and protection from a variety of physical impacts by projectiles. In particular, even though the fiber layers of the door 10 and/or door frame 20, 21 are extremely thin (e.g., about 0.02 inches thick), the fiber layers (e.g., 30 fiber layers, 16 fiber layers, 14 fiber layers, 8 fiber layers, 6 fiber layers, 4 fiber layers, 2 fiber layers, or a single fiber layer, arranged in a stacked formations) are structured to provide various UL level protection from ballistic projectiles (e.g., firearm, or the like) and also protection from other projectiles such as debris or shrapnel. As such, the one or more projectile resistant layers, each comprising the one or more fiber layers (e.g., fabric layer, plastic layers, or the like as discussed herein), may alone or in combination with other layers, provide a door 10 and/or door frame 20, 21 that provides the desired FE (forced entry) and/or BR (Bullet/Ballistic Resistant) properties while providing reduced weights and/or improved shipping and/or installation processes. For example, the door 10 and/or door frame 20, 21 may have UL752 Level 1 (9 mm handgun) to UL 752 Level 10 (.50 Caliber Rifle) protection, and in particular embodiments UL752 level 1 (9 mm), UL752 level 2 (.357 Magnum), UL752 level 3 (.44 Magnum), UL752 level 4 (.30 Caliber Rifle), UL752 level 5 (7.63 Caliber Rifle) UL752 level 6 (9 mm Rifle), UL752 level 7 (5.56 mm), UL752 level 8 (7.62 mm), UL752 level 9 (.30-06 rifle), UL752 level 10 (.50 caliber rifle), or the like protection, or have protection that ranges between, overlaps, or falls outside of these levels of protection. Furthermore, the door 10 and/or door frame 20, 21 may also be rated to withstand 5, 10, 15, 20, 25, 30, 40, 50, 60, or the like minutes of simulated "mob" attack, or range between, overlap, or outside of these levels of protection. In some embodiments of the invention, the fiber layers may be fabric layers of basalt woven fabric, other similar material. In some embodiments of the invention, the fiber layers may be plastic layers of UHMWPE. In some embodiments of the invention, the one or more projectile resistant layers may comprise other types of materials, such as, but not limited to Kevlar or other Bullet resistant fabrics (e.g., woven fabric, non-woven fabric, knitted fabric, other fabrics, or the like) or bullet resistant plastic that provide the same or similar protection as described with respect to the fiber layers. The protective or filler layers and materials can be added separately, or may be bonded together using structural adhesives, resins, heat, mechanical or other similar means. Furthermore, the costs of the various layers of the composite sliding door systems 1 are about half the cost of conventional materials without adding bulk to the composite sliding door systems 1 (e.g., doors 10 and/or door frame 20, 21 in which they are used).

Moreover, the sheet layers, such as a porous sheet (e.g., the aluminum foam, or the like), used in the door 10 and/or door frame 20, 21 are structured to exhibit electrical resistance (e.g., because it does not conduct electricity), provide EMI shielding as previously discussed herein, provide fire protection (e.g., because it is non-inflammable), and provide various other properties that conventional materials are not able to provide. In other embodiments, the sheet layers may comprise a polycarbonate, SGG material, or other type of foam sheet.

Furthermore, fill material is described generally herein as providing additional material in order to fill out the thickness of the door 10 and/or the door frame 20, 21 (if needed) and in some embodiments provide an insulated core to at least a portion of the door 10 and/or door frame 20, 21. While the fill material is generally described as being a polystyrene sheet or other type of structure (e.g., loose material, or the like), it should be understood that the fill material may be any type of material (e.g., lightweight, or the like), such as, but not limited to a polyisocyanurate, polyurethane, fiberglass, cellulose, mineral wool, kraft paper (e.g., structural, or the like), plastics, polycarbonates, vermiculite, perlite, cementitious foam (e.g., magnesium oxide, such as magnesium silicate), phenolic foam, or other like material. In some embodiments, the material may provide insulation and/or protective properties within one or more cavities of the door frame 20. The insulation may provide additional thermal protection between the inner side and outer side of the door frame 20. As such, in some embodiments a cavity formed between the door frame 20 and the wall 2 may be filled with material that provides fire resistance, EMC (EMI-RFI) shielding, Gamma shielding, and/or insulation, or the like. The material may comprise RockWool, concrete, fiberglass, polystyrenes, honeycomb, hybrid layers, compound materials, curable and hardenable insulation material, or the like. Alternatively, blast (Blast Resistant), forced entry (FE) and/or ballistic resistant (BR) material may be provided within the door frame 20 before assembly within the door opening and/or after assembly of the door frame 20 with the door opening. Regardless of the fill material, it may provide structural, protective, sound transmission prevention, fire resistance or fire proofing, or the like properties. In some embodiments the fill material may also have projectile resistance (e.g., firearm, blast, weather related resistance—wind, projectile, or the like, mob attack) and/or may have other properties that provide chemical resistance, radio frequency resistance, electromagnetic resistance, or the like.

Moreover, the door system 1 and in particular the sliding door 1 and/or door frames 20, 21 (or a wall located adjacent the sliding doors 1) may include one or more energy harvesting components, such as layers over at least a portion of the door 10 (e.g., glazed sliding door). The energy harvesting layer may be any type of layer such as a screen, a coating (e.g., conductive coating, or the like), a glazing, a film, fabric (e.g., woven and/or non-woven), composites, 3-D printed materials, or other like layer and/or circuits, solenoids, capacitors, wireless or wired energy transfer technologies, or other like devices that are able to capture energy (e.g., from the sun, movement of the door, or the like).

FIG. 20 illustrates a process for manufacturing and/or installing the door frame (e.g., single door frame segment 21, adjustable door frame 20, or the like), as described herein. In some embodiments of the invention, the single door frame segment and/or the one or more of the door frame segments 30, 40 may be a standard size and configuration. For example, single door frame segments may be manufactured for different size door opening widths. In other examples, the first door frame segment 30, the second door frame segment 40, or both may be standard sizes. The frame segments 30, 40 may allow for different ranges of thicknesses for different wall thicknesses. Therefore, as illustrated by block 210 of FIG. 20, the segments for the door frame 20, 21 may be manufactured (e.g., rolled, stamped, bent, extruded, molded, or the like). As further illustrated in block 220 of FIG. 20, the one or more caps 60, 70, retainers 90, headers 100, seals 300, or the like may be manufactured (e.g., rolled, stamped, bent, extruded, molded, or the like). The segments 30, 40, caps 60, 70, retainers 90, headers 100, seals 300, or the like may be determined, manufactured, and/or provided based on customer preferences.

As such, as illustrated in block 230, in response to receiving an order from a customer, one or more door frames 20 may be shipped to a customer. It should be understood that the segments 30, 40, caps 60, 70, retainers 90, headers 100, seals 300, or the like may be packaged and shipped unassembled, partially assembly, and/or assembled (e.g., segments, caps, retainer, header, seals, or the like may be shipped as separate parts, or at least partially assembled). Since the segments 30, 40 are adjustable, even though the customer may have walls of different thicknesses, all the segments 30, 40 may be the same size. In alternate embodiments, there may be different size segments 30, 40 that allow for adjustment over different ranges of wall thicknesses.

Block 240 further illustrates that on site the installer may assemble the segments 30, 40, and/or a portion of the segments 30, 40, such as operatively coupling the segments 30, 40, together and/or adjusting the segments 30, 40 with respect to each other based on the specific wall thickness of the door opening. As such, the installer may use segment connectors 150 before assembling the door frame portions 24, 26, 28 to the door opening. For example, the first frame segment 30 may be moved with respect to the second frame segment 40 in order to set a frame width for the door frame 20.

Block 250 of FIG. 20 illustrates that the frame portions (e.g., the upper portion 24 disposed adjacent an upper end of a door opening, and two side portions 26, 28 disposed along either edge of the door opening) are installed onto the wall 2 of the door opening. Alternatively, the first frame segment 30 or the second frame segment 40 (e.g., the segment that is overlapped is installed first, or the like) may be installed individually to the wall of the door opening. Regardless of the installation order, the door frame portions 24, 26, 28 may be installed on the upper and side portions of the door opening using frame connectors 25 (e.g., clips, tabs, fasteners, or the like). For example, corner tabs and hanger tabs may be used to secure to the door frame portions 24, 26, 28 to the door opening surfaces (e.g., the wall 2, around the door opening edges 9, and/or to the adjacent door frame portions 24, 26, 28).

Block 260 of FIG. 20 illustrates that the security features may be applied to the door 10, door frame 20, 21, caps 60, 70, retainer 90, header 100, seals 300, or the like. The security features may include the EMC shielding 350, the sound abatement, fire and/or smoke abatement, air flow abatement, or the like materials as described herein.

FIG. 20 further illustrates in block 270, that the caps 60, 70, retainer 90, header 100 (e.g. including the tracks, wheels, dampers, closers, stops, or the like), the seals 300, or the like are installed to the frame portions (e.g., single frame segment, first frame segment 30, second frame segment 40, or the like), the wall 2, or the like and/or the door hardware 4 (e.g., tracks, rollers, wheels, dampers, closers, stops, or the like) is assembled to the door 10.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and should not be interpreted in an idealized or overly formal sense unless expressly so defined herein. Certain terminology is used herein for convenience only and is not to be taken as a limitation on the invention. For example, words such as "distal," "proximal," "upper," "top," "bottom," "lower," "left," "right," "horizontal," "vertical," "upper," and "lower", or other like terminology merely describe the configuration shown in the figures. The referenced components may be oriented in an orientation other than that shown in the drawings and the terminology, therefore, should be understood as encompassing such variations unless specified otherwise.

As used herein, the singular forms "a", "an" and "the" are intended to include the plural forms as well, unless the context clearly indicates otherwise. It will be further understood that the terms "includes" and/or "including" when used herein, specify the presence of stated features, steps, operations, elements, and/or components, but do not preclude the presence or addition of one or more other features, steps, operations, elements, components, and/or groups thereof.

It will be understood that when an element is referred to as "operatively coupled" to another element, the elements can be formed integrally with each other, or may be formed separately and put together. Furthermore, "operatively coupled" to can mean the element is directly coupled to the other element, or intervening elements may be present between the elements. Furthermore, "operatively coupled" may mean that the elements are detachable from each other, or that they are permanently operatively coupled together.

When components are described as being parallel or perpendicular to other components, it should be understood that this many encompass the components being exactly parallel or perpendicular, or generally parallel or perpendicular in which the components deviate from exactly parallel or perpendicular (e.g., +/−1, 2, 4, 6, 8, 10, 15, 20, 25, or the like degrees from exactly parallel or perpendicular).

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

INCORPORATION BY REFERENCE

To supplement the present disclosure, this application further incorporates entirely by reference the following commonly assigned patent applications

| Docket Number | U.S. Patent Application Ser. No. | Title | Filed On |
|---|---|---|---|
| 014924-000026 | To be assigned | ADJUSTABLE FRAME WITH A THERMAL BREAK | Concurrently herewith |
| 014924-000028 | To be assigned | ADJUSTABLE FRAME WITH A THERMAL BREAK SEAL | Concurrently herewith |
| 044824-000008 | To be assigned | ADJUSTABLE DOOR FRAME FOR A SLIDING DOOR | Concurrently herewith |

What is claimed is:

1. A door system comprising:

a door frame operatively coupled with one or more door opening surfaces, wherein the door frame is an adjustable door frame, comprising:

a first frame segment having a first molding flange and a first jamb flange; and a second frame segment having a second molding flange and a second jamb flange;

one or more adjustment members operatively coupled to the first frame segment or the second frame segment, wherein the one or more adjustment members comprise one or more adjustment tabs having a tab aperture for guiding slidable adjustment;

wherein the first frame segment is adjustable with respect to the second frame segment through the one or more adjustment members;

wherein the first frame segment is operatively coupled with the second frame segment through the one or more adjustment members; and wherein at least a portion of the first jamb flange and at least a portion of the second jamb flange of the adjustable door frame overlap;

one or more caps operatively coupled to the first molding flange or the second molding flange;

sliding door hardware operatively coupled to the one or more door opening surfaces or the door frame;

a door operatively coupled to the sliding door hardware; and a plurality of seals operatively coupled to the door frame or the door, the plurality of seals comprising:

a first edge seal;

a second edge seal;

a top edge seal; and a bottom edge seal;

wherein the one or more caps or the door comprises a seal channel formed therein; and wherein the seal channel formed in the one or more caps or the door is operatively coupled to the first edge seal or the second edge seal.

2. The door system of claim 1, wherein the plurality of seals comprise:

seal material made from an electromagnetic compatibility (EMC) material to provide EMC shielding, wherein the EMC material provides electromagnetic interference (EMI) or radio frequency interference (RFI) shielding.

3. The door system of claim 2, wherein the door frame is covered by the EMC material or made from the EMC material.

4. The door system of claim 2, wherein door edges are covered in the EMC material, and the door is covered in EMC material, has one or more layers of EMC material, or is made from the EMC material.

5. The door system of claim 1, further comprising:

a retainer having multiple retainer walls forming a retainer cavity, the retainer being operatively coupled to the first molding flange or the second molding flange;

wherein the first edge seal or the second edge seal that is not operatively coupled to the seal channel is operatively coupled to the retainer within the retainer cavity; and wherein the retainer cavity receives a side edge of the door.

6. The door system of claim 1, wherein the one or more adjustment members comprise:

an adjustment receptacle configured to receive the adjustment tab.

7. The door system of claim 1, further comprising:

one or more segment connectors extending through the first molding flange, the second molding flange, the first jamb flange, or the second jamb flange and into a portion of a support member.

8. The door system of claim 1, wherein the one or more caps comprise:

a first molding cap operatively coupled to the first molding flange, wherein the first molding cap comprises:

a first wall cap leg;

a first molding cap face; and a first jamb cap leg operatively coupled to the first molding cap face;

a second molding cap operatively coupled to the second molding flange, wherein the second molding cap comprises:

a second wall cap leg;

a second molding cap face; and a second jamb cap leg operatively coupled to the second molding cap face.

9. The door system of claim 8, wherein an outer surface of the first jamb cap leg is flush with an outer surface of the first jamb flange and an outer surface of the second jamb cap leg is flush with an outer surface of the second jamb flange.

10. The door system of claim 8, wherein the first jamb cap leg overlaps the first jamb flange and the second jamb flange, and wherein an end of the first jamb cap leg is adjacent an end of the second jamb cap leg.

11. The door system of claim 8, wherein the first jamb flange or the second jamb flange are operatively coupled to each other or a support member using one or more segment connectors; and wherein the first jamb cap leg or the second jamb cap leg conceal the one or more segment connectors.

12. The door system of claim 8, wherein the first jamb flange overlaps a portion of the second jamb flange, wherein an end of the second jamb cap leg is adjacent to an end of the first jamb flange, and wherein an outer surface of the first jamb flange and an outer surface of the second jamb cap leg are flush.

13. The door frame of claim 1, wherein the first frame segment comprises:

one or more proximal jamb portions; and one or more distal jamb portions operatively coupled to the one or more proximal jamb portions;

wherein the one or more proximal jamb portions adjacent to the one or more distal jamb portions form one or more jamb channels that receive at least a portion of the second jamb flange.

14. The door system of claim 1, wherein the seal channel is formed within or attached to the door or wherein the seal channel is formed within the one or more caps.

15. The door system of claim 1, wherein the plurality of seals provide one or more of EMC shielding, sound abatement, light abatement, fire or smoke abatement, or air flow abatement.

16. The door system of claim 1, wherein the first edge seal or the second edge seal that is not operatively coupled to the seal channel is operatively coupled adjacent to a door edge, to a frame portion of the door frame, or within a receiver channel formed by a receiver that is operatively coupled to the frame portion and configured to receive an edge of the door; wherein the top edge seal is operatively coupled adjacent to an upper edge of the door or a header that is operatively coupled to the door frame or a wall and the header that is configured to receive the upper edge of the door; and a bottom seal is operatively coupled adjacent to a bottom edge of the door or to a floor.

17. The door frame of claim 1, further comprising:
a header comprising:
    a header mount;
    a header body operatively coupled to the header mount; and
    a header cap operatively coupled to the header mount or the header body;
    wherein the header mount, the header body, or the header cap form a header channel; and
    wherein the header channel receives an upper edge of the door.

18. The door system of claim 1, wherein the tab aperture comprises a slot defining a slot length and a slot width, the one or more adjustment members being slidable in the direction of the slot length.

19. A door system comprising:
an adjustable door frame comprising three or more portions, each comprising:
    a first frame segment having a first molding flange and a first jamb flange; and
    a second frame segment having a second molding flange and a second jamb flange;
    one or more adjustment members operatively coupled to the first frame segment or the second frame segment, wherein the one or more adjustment members comprise one or more adjustment tabs having a tab aperture for guiding slidable adjustment;
    wherein the first frame segment is adjustable with respect to the second frame segment through the one or more adjustment members;

wherein the first frame segment is operatively coupled with the second frame segment through the one or more adjustment members;
    wherein at least a portion of the first jamb flange and at least a portion of the second jamb flange of the adjustable door frame overlap;
    wherein the adjustable door frame is operatively coupled to door opening surfaces; and
    wherein the first frame segment or the second frame segment is covered in EMC material or made from the EMC material;
one or more caps operatively coupled to the first molding flange or the second molding flange;
sliding door hardware operatively coupled to a wall or the adjustable door frame;
a door operatively coupled to the sliding door hardware, wherein door edges are covered in the EMC material and door faces are covered in the EMC material or have a layer of EMC material; and
a plurality of seals operatively coupled to the adjustable door frame or the door, the plurality of seals made from the EMC material, the plurality of seals comprising:
    a first edge seal adjacent a first edge of the door;
    a second edge seal adjacent a second edge of the door;
    a top edge seal adjacent an upper edge of the door; and
    a bottom edge seal adjacent a lower edge of the door;
wherein the one or more caps or the door comprises a seal channel formed therein; and
wherein the seal channel formed in the one or more caps or the door is operatively coupled to the first edge seal or the second edge seal.

\* \* \* \* \*